(12) United States Patent
Yu et al.

(10) Patent No.: US 7,915,166 B1
(45) Date of Patent: Mar. 29, 2011

(54) DIFFUSION BARRIER AND ETCH STOP FILMS

(75) Inventors: Yongsik Yu, Lake Oswego, OR (US);
Pramod Subramonium, Tigard, OR (US); Zhiyuan Fang, West Linn, OR (US); Jon Henri, West Linn, OR (US); Elizabeth Apen, West Linn, OR (US); Dan Vitkavage, Tualatin, OR (US)

(73) Assignee: Novellus Systems, Inc., San Jose, CA (US)

( * ) Notice: Subject to any disclaimer, the term of this patent is extended or adjusted under 35 U.S.C. 154(b) by 817 days.

(21) Appl. No.: 11/710,652

(22) Filed: Feb. 22, 2007

(51) Int. Cl.
*H01L 21/302* (2006.01)
*H01L 21/461* (2006.01)

(52) U.S. Cl. ........ 438/687; 438/628; 438/763; 438/791; 438/780; 257/E21.17; 257/E21.171; 257/E21.576

(58) Field of Classification Search .................. 438/687, 438/628, 791; 257/751, 758, 762, E21.17, 257/E21.171, E21.576
See application file for complete search history.

(56) References Cited

U.S. PATENT DOCUMENTS

| | | | |
|---|---|---|---|
| 4,177,474 A | 12/1979 | Ovshinsky | |
| 4,656,110 A | 4/1987 | Yamazaki | |
| 4,863,760 A | 9/1989 | Schantz et al. | |
| 5,034,355 A | 7/1991 | Tani et al. | |
| 5,108,965 A | 4/1992 | Tani et al. | |
| 5,324,690 A | 6/1994 | Gelatos et al. | |
| 5,464,699 A | 11/1995 | Baldi | |
| 5,654,208 A | 8/1997 | Harris et al. | |
| 5,739,579 A | 4/1998 | Chiang et al. | |
| 5,958,324 A | 9/1999 | Bujalski et al. | |
| 6,045,877 A | 4/2000 | Gleason et al. | |
| 6,100,587 A | 8/2000 | Merchant et al. | |
| 6,143,657 A | 11/2000 | Liu et al. | |
| 6,150,719 A * | 11/2000 | Saia et al. | 257/751 |
| 6,159,871 A | 12/2000 | Loboda et al. | |
| 6,197,688 B1 | 3/2001 | Simpson | |

(Continued)

FOREIGN PATENT DOCUMENTS

DE     2005/048367     11/2004

OTHER PUBLICATIONS

Masahiko Maeda, et al., "A Low-Permittivity Interconnection Using an SiBN Interlayer", Sep. 1989, IEEE Transactions on Electron Devices, vol. 36, No. 9.

(Continued)

*Primary Examiner* — Alexander G Ghyka
*Assistant Examiner* — Abdulfattah Mustapha
(74) *Attorney, Agent, or Firm* — Weaver Austin Villeneuve & Sampson LLP

(57) ABSTRACT

Films having high hermeticity and a low dielectric constant can be used as copper diffusion barrier films, etch stop films, CMP stop films and other hardmasks during IC fabrication. Hermetic films can protect the underlying layers, such as layers of metal and dielectric, from exposure to atmospheric moisture and oxygen, thereby preventing undesirable oxidation of metal surfaces and absorption of moisture by a dielectric. Specifically, a bi-layer film having a hermetic bottom layer composed of hydrogen doped carbon and a low dielectric constant (low-k) top layer composed of low-k silicon carbide (e.g., high carbon content hydrogen doped silicon carbide) can be employed. Such bi-layer film can be deposited by PECVD methods on a partially fabricated semiconductor substrate having exposed layers of dielectric and metal.

24 Claims, 8 Drawing Sheets

U.S. PATENT DOCUMENTS

| | | | |
|---|---|---|---|
| 6,242,686 B1 | 6/2001 | Kishimoto et al. | |
| 6,352,945 B1 | 3/2002 | Matsuki | |
| 6,383,898 B1 | 5/2002 | Kishimoto et al. | |
| 6,383,955 B1 | 5/2002 | Matsuki | |
| 6,399,484 B1 | 6/2002 | Yamasaki et al. | |
| 6,410,419 B1 | 6/2002 | Merchant et al. | |
| 6,417,092 B1 | 7/2002 | Jain et al. | |
| 6,424,044 B1 | 7/2002 | Han et al. | |
| 6,432,846 B1 | 8/2002 | Matsuki | |
| 6,455,409 B1 | 9/2002 | Subramanian et al. | |
| 6,465,372 B1 | 10/2002 | Xia et al. | |
| 6,506,692 B2 | 1/2003 | Andideh | |
| 6,573,030 B1 | 6/2003 | Fairbairn et al. | |
| 6,670,715 B2 | 12/2003 | Yang et al. | |
| 6,764,958 B1 | 7/2004 | Nemani et al. | |
| 6,774,489 B2 | 8/2004 | Russell et al. | |
| 6,790,767 B2 | 9/2004 | Lee | |
| 6,790,788 B2 | 9/2004 | Li et al. | |
| 6,821,890 B2 | 11/2004 | McGabay | |
| 6,855,645 B2 | 2/2005 | Tang et al. | |
| 6,881,683 B2 | 4/2005 | Matsuki et al. | |
| 6,890,850 B2 | 5/2005 | Lee et al. | |
| 6,967,405 B1 | 11/2005 | Yu et al. | |
| 7,064,088 B2 | 6/2006 | Hyodo et al. | |
| 7,091,137 B2 | 8/2006 | Lee et al. | |
| 7,115,534 B2 | 10/2006 | Nguyen et al. | |
| 7,163,889 B2 | 1/2007 | Yu et al. | |
| 7,239,017 B1 | 7/2007 | Yu et al. | |
| 7,282,438 B1 | 10/2007 | Yu et al. | |
| 7,420,275 B1 | 9/2008 | Yu et al. | |
| 7,573,061 B1 | 8/2009 | Yu et al. | |
| 7,820,556 B2 | 10/2010 | Hsu et al. | |
| 2001/0021491 A1* | 9/2001 | Chen et al. | 430/523 |
| 2003/0001275 A1 | 1/2003 | Sambucetti et al. | |
| 2003/0049460 A1 | 3/2003 | O'Neil et al. | |
| 2003/0057553 A1 | 3/2003 | DelaRosa et al. | |
| 2003/0068881 A1 | 4/2003 | Xia et al. | |
| 2003/0082296 A1 | 5/2003 | Elers et al. | |
| 2003/0089992 A1 | 5/2003 | Rathi et al. | |
| 2003/0162033 A1 | 8/2003 | Johnson et al. | |
| 2003/0194496 A1 | 10/2003 | Xu et al. | |
| 2003/0232150 A1 | 12/2003 | Arnold et al. | |
| 2003/0232514 A1 | 12/2003 | Kim et al. | |
| 2004/0067308 A1 | 4/2004 | Zheng et al. | |
| 2004/0084774 A1 | 5/2004 | Li et al. | |
| 2004/0097075 A1 | 5/2004 | Bradshaw et al. | |
| 2004/0113279 A1 | 6/2004 | Chen et al. | |
| 2004/0124531 A1 | 7/2004 | Venkatraman et al. | |
| 2004/0207084 A1 | 10/2004 | Hedrick et al. | |
| 2005/0014361 A1 | 1/2005 | Nguyen et al. | |
| 2005/0042889 A1* | 2/2005 | Lee et al. | 438/780 |
| 2005/0112506 A1 | 5/2005 | Czech et al. | |
| 2005/0202685 A1 | 9/2005 | Huang et al. | |
| 2005/0233555 A1 | 10/2005 | Rajagopalan et al. | |
| 2005/0236711 A1 | 10/2005 | Wang et al. | |
| 2005/0245071 A1 | 11/2005 | Wu et al. | |
| 2005/0277302 A1 | 12/2005 | Nguyen et al. | |
| 2006/0019486 A1* | 1/2006 | Yu et al. | 438/628 |
| 2006/0046479 A1 | 3/2006 | Rajagopalan et al. | |
| 2006/0091559 A1 | 5/2006 | Nguyen et al. | |
| 2006/0110931 A1 | 5/2006 | Fukazawa et al. | |
| 2007/0035029 A1 | 2/2007 | Caubet et al. | |
| 2007/0037388 A1 | 2/2007 | Hohage et al. | |
| 2007/0166546 A1* | 7/2007 | Ichikawa et al. | 428/408 |
| 2007/0247073 A1 | 10/2007 | Paterson et al. | |
| 2008/0063809 A1 | 3/2008 | Lee et al. | |
| 2008/0070396 A1 | 3/2008 | Budrevich et al. | |
| 2008/0122103 A1 | 5/2008 | Bonilla et al. | |
| 2008/0128907 A1* | 6/2008 | Yang et al. | 257/751 |
| 2008/0254641 A1* | 10/2008 | Kobayashi et al. | 438/763 |
| 2010/0151691 A1 | 6/2010 | Henri et al. | |

OTHER PUBLICATIONS

Takashi Sugino, et al., "Synthesis of boron nitride film with low dielectric constant for its application to silicon ultralarge scale integrated semiconductors", 2001 Elsevier Science B.V., Diamond and Related Materials 1275-1379.

Yu, et al., "Low-K B-Doped SiC Copper Diffusion Barrier Films", Novellus Systems, Inc. U.S. Appl. No. 10/915,117, filed Aug. 9, 2004, pp. 1-22.

U.S. Office Action mailed Feb. 24, 2005, from U.S. Appl. No. 10/670,660.

U.S. Office Action mailed May 3, 2006, from U.S. Appl. No. 10/915,117.

Yu et al., "Low-K Sic Copper Diffusion Barrier Films", Novellus Systems, Inc., U.S. Appl. No. 10/869,474, filed Jun. 15, 2004, pp. 1-25.

Yu et al., "Boron-Doped SiC Copper Diffusion Barrier Films", Novellus Systems, Inc., U.S. Appl. No. 11/373,847, filed Mar. 8, 2006, pp. 1-22.

U.S. Office Action mailed Sep. 6, 2006, from U.S. Appl. No. 10/869,474.

U.S. Office Action mailed Sep. 7, 2006, from U.S. Appl. No. 10/915,117.

U.S. Office Action mailed Dec. 11, 2006, from U.S. Appl. No. 10/915,117.

U.S. Office Action mailed Feb. 9, 2007, from U.S. Appl. No. 10/869,474.

Novellus Systems, Inc., van Schravendijk et al., "Protection of CU Damascene Interconnects by Formation of a Self-Aligned Buffer Layer" U.S. Appl. No. 10/980,076, filed Nov. 3, 2004 (37 pages).

Novellus Systems, Inc., Subramonium et al., "Methods of Depositing Stable and Hermetic Ashable Hardmask Films" filed Feb. 22, 2007 (26 pages).

U.S. Appl. No. Unknown, Filed Feb. 20, 2007, Entitled "Protective Self-Aligned Buffer Layers for Damascene Interconnects".

Qingguo (Gordon) Wu et al., "Ultra Low k Dielectrics Prepared by PECVD Using a Single-Precursor and Treated by UV Assisted Thermal Processing", Oct. 17-19, 2006, Advanced Metallization Conference (AMC) 2006, San Diego, CA, pp. 1-6.

U.S. Office Action mailed May 1, 2008, U.S. Appl. No. 11/373,847.

U.S. Office Action mailed Apr. 10, 2009, U.S. Appl. No. 11/805,356.

Chattopadhyay et al. (Mar. 29, 2007), "Methods for Reducing UV and Dielectric Diffusion Barrier Interaction," U.S. Appl. No. 11/693,617.

Wu et al. (Oct. 17-19, 2006), "Ultra Low k Dielectrics Prepared by PECVD Using a Single-Precursor and Treated by UV Assisted Thermal Processing," Advanced Metallization Conference (AMC) 2006, pp. 1-6, San Diego, CA.

Wu et al. (Mar. 29, 2007), Methods for Improving Performance of ODC Films With Dielectric Constant.

US Final Office Action (Sep. 7, 2006) from U.S. Appl. No. 10/915,117.

US Office Action (Sep. 6, 2006) from U.S. Appl. No. 10/869,474.

US Final Office Action (Jun. 28, 2007) from U.S. Appl. No. 10/869,474.

US Notice of Allowance (Jul. 26, 2007) from U.S. Appl. No. 10/869,474.

Notice of Allowance and Allowed Claims for U.S. Appl. No. 11/373,847, mailed Jul. 1, 2008, Yu et al.

Notice of Allowance and Allowed Claims for U.S. Appl. No. 11/893,490 mailed May 4, 2009.

Yu et al., "Low-K Sic Copper Diffusion Barrier Films", Novellus Systems, Inc., U.S. Appl. No. 12/497,322, filed Jul. 2, 2009.

U.S. Office Action mailed Aug. 28, 2009, U.S. Appl. No. 11/693,661.

U.S. Office Action mailed Oct. 7, 2009, U.S. Appl. No. 11/693,617.

U.S. Final Office Action mailed Oct. 13, 2009, U.S. Appl. No. 11/805,356.

U.S. Office Action mailed Feb. 24, 2010, U.S. Appl. No. 11/693,661.

U.S. Office Action mailed Apr. 8, 2010, U.S. Appl. No. 11/805,356.

U.S. Office Action mailed Jun. 10, 2010, U.S. Appl. No. 11/693,617.

Notice of Allowance and Allowed Claims for U.S. Appl. No. 11/805,356 mailed Jul. 26, 2010.

Rangarajan et al., "Hardmask Materials", Novellus Systems, Inc., U.S. Appl. No. 12/631,691, filed Dec. 4, 2009.

Wu et al "Reducing UV and Dielectric Diffusion Barrier Interaction Through The Modulation of Optical Properties", Novellus Systems, Inc., U.S. Appl. No. 12/082,496, filed Apr. 11, 2008.

U.S. Office Action mailed Oct. 15, 2010 for U.S. Appl. No. 12/497,322.

U.S. Office Action mailed Mar. 31, 2010 for U.S. Appl. No. 11/710,377.

U.S. Final Office Action mailed Aug. 19, 2009 for U.S. Appl. No. 11/710,377.

U.S. Office Action mailed Jan. 5, 2009 for U.S. Appl. No. 11/710,377.

Fang et al., "Methods of Improving Ashable Hardmask Adhesion to Metal layers," Novellus Systems, Inc., U.S. Appl. No. 11/612,382, filed Dec. 18, 2006.

Subramonium et al., "Pulsed PECVD Method for Modulating Hydrogen Content in Hard Mask," Novellus Systems, Inc., U.S. Appl. No. 12/048,967, filed Mar. 14, 2008.

Subramonium et al., "Methods of Depositing Highly Selective Transparent Ashable Hardmask Films", U.S. Appl. No. 11/449,983, filed Jun. 8, 2006.

Subramonium et al., "Methods of Depositing Stable and Hermetic Ashable Hardmask Films," Novellus Systems, Inc., U.S. Appl. No. 11/710,377, filed Feb. 22, 2007, pp. 1-26.

Subramonium et al., "Methods and Apparatus for Plasma-Based Deposition," Novellus Systems, Inc., U.S. Appl. No. 11/849,208, filed Aug. 31, 2007.

Subramonium et al., "Methods of Depositing Smooth and Conformal Ashable Hard Mask Films," Novellus Systems, Inc., U.S. Appl. No. 12/163,670, filed Jun. 27, 2008.

Fox et al., "Methods for Forming Conductive Carbon Films by PECVD", Novellus Systems, Inc., U.S. Appl. No. 12/766,721, filed Apr. 23, 2010.

Hsu et al, "Method for purifying acetylene gas for use in semiconductor processes", Novellus Systems, Inc., U.S. Appl. No. 12/786,842, filed May 25, 2010.

* cited by examiner

DIFFUSION BARRIER AND ETCH STOP FILMS

FIELD OF THE INVENTION

This invention relates to low dielectric constant films with hermetic properties for use in various applications. The invention also relates to methods of forming low dielectric constant films with improved performance in a wide range of VLSI and ULSI fabrication operations.

BACKGROUND OF THE INVENTION

There is a general need for materials with low dielectric constants (low-k) in the integrated circuit manufacturing industry. Using low-k materials as the interlayer dielectric (ILD) of conductive interconnects reduces the delay in signal propagation and signal crosstalk due to capacitive effects. The lower the dielectric constant of the dielectric, the lower the capacitance of the dielectric and the RC delay in the lines and signal crosstalk between electrical lines of the integrated circuit (IC). Further, the use of a low k material as an interlayer dielectric reduces the power consumption of complex integrated circuits.

Low dielectric constant (k) ("low-k"), insulators, with k significantly lower than that of $SiO_2$ (3.9), are now used as inter-layer dielectric, e.g., as inter-metal dielectric (IMD) for reducing capacitive coupling and improving switching performance of integrated circuits (IC). For example, porous carbon doped silicon dioxide or fluorine doped silicon dioxide provide a dielectric constant of less than about 3.0. In this regard, the effective dielectric constant ($k_{eff}$) encountered by the signal in the interconnect structure is an important parameter.

Cu/IMD integration schemes typically involve the incorporation of other materials along with the bulk inter-metal dielectric material, forming a stack. These other materials may include copper diffusion barrier, copper capping layer and hardmask (e.g., CMP and etch stop) materials needed to prevent copper poisoning of the bulk low-k dielectric, to minimize electromigration, to protect the relatively soft low-k dielectric, and to facilitate the Damascene processing used in the device fabrication. These materials have a substantial impact on the effective k of the IMD stack. For example, an etch stop layer having a higher dielectric constant than the insulating IMD material located proximate to it increases the overall effective k of the IMD stack. Thus, materials used for etch stop, barrier and capping layers must meet the dual challenges of minimizing the effective k of the stack while providing material selectivity and protection for the IMD layers.

The challenges related to etch stop and barrier layer integration stem from the lack of low-k materials possessing suitable mechanical and electrical characteristics. While conventionally used silicon nitride (SiN) and silicon carbide (SiC) materials provide good etch selectivity and generally have good mechanical characteristics, their dielectric constant is very high. For example, SiN has a dielectric constant of about 7, and SiC formed using tetramethylsilane typically has a k value in the range of about 4.3-5.5. When used in a multi-layer stack with low-k IMD, such as carbon or fluorine doped silicon dioxide, having a dielectric constant of less than about 3.0, SiN and SiC raise the effective dielectric constant of the IMD stack to the levels that may not be acceptable for current and future levels of miniaturization.

There is currently a need in the IC fabrication industry for films with low effective dielectric constant that also possess properties that meet integration requirements developed for diffusion barrier films, etch stop films and the like.

SUMMARY

One of such desirable properties is hermeticity. Films having high hermeticity and a low dielectric constant are herein provided. These films can be employed in a variety of applications in integrated circuit (IC) fabrication that require such combination of properties. These films are particularly suitable for use as copper diffusion barrier films, etch stop films, CMP stop films and other hardmasks used during semiconductor processing. Hermetic low-k films can protect the underlying layers, such as layers of metal and dielectric, from exposure to atmospheric moisture and oxygen, thereby preventing undesirable oxidation of metal surfaces and absorption of moisture by a dielectric. In certain embodiments, the hermetic films described herein substantially prevent penetration of any or all of ambient atmospheric components including moisture, oxygen, carbon dioxide and nitrogen. In particular embodiments, the hermetic films act as barriers to at least atmospheric moisture and/or oxygen.

Specifically, a bi-layer film having a hermetic bottom layer composed of hydrogen doped carbon and a low dielectric constant (low-k) top layer composed of low-k silicon carbide (e.g., high carbon content hydrogen doped silicon carbide) can be employed. Such bi-layer film can be deposited by PECVD methods on a partially fabricated semiconductor substrate having exposed layers of dielectric and metal. In some embodiments, the top portions of exposed metal lines or interconnects are converted to protective self-aligned buffer (PSAB) layers prior to formation of the bi-layer barrier in order to improve adhesion and to reduce the possibility of inadvertent oxidation of metal surfaces and metal electromigration.

In one aspect, a copper diffusion barrier film stack for use in a semiconductor device is provided. The diffusion barrier film stack includes a hermetic hydrogen doped carbon layer, and a hydrogen doped silicon carbide layer, wherein the hydrogen doped silicon carbide layer is stacked on top of the hydrogen doped carbon layer.

The thickness of the diffusion barrier film can range from about 10 to 10000 Å. The effective dielectric constant of the entire copper diffusion barrier film stack in some embodiments is less than about 4.0, e.g., between about 3.0 and 4.0. The diffusion barrier film provides high hermeticity, which can be defined by a small tensile TEOS stress shift. In some embodiments, the tensile TEOS stress shift for the diffusion barrier film is less than 10 MPa.

The hermetic hydrogen doped carbon layer is characterized, in some embodiments, by a hermeticity defined by a tensile TEOS stress shift of less than 10 MPa. In some embodiments the hermetic hydrogen doped carbon material is characterized by a carbon content of between about 50-80 atomic %. In some embodiments this material is characterized by high density (e.g., a density of at least about 1.3 g/mL) and high $sp^3$ carbon content. In some embodiments, the hermetic hydrogen doped carbon material may have a ratio between the $sp^3$ and the $sp^2$ hybridized carbon is at least about 2 to 1. In some embodiments, the ratio between the $sp^3$ and the $sp^2$ hybridized carbon in this material is between about 2 to 1 and 10 to 1.

It is, of course, preferable that the dielectric constant of the hermetic layer is low. In some embodiments, the hermetic hydrogen doped carbon layer has a dielectric constant of less than about 4.2.

A variety of low-k silicon carbide based materials can be used for the top low-k layer of the barrier film stack. Preferably, materials with a dielectric constant of less than 3.5 are used. In one embodiment, the low-k top layer material is a hydrogen doped silicon carbide with a composition defined by a $Si_xC_yH_z$, formula, wherein carbon (C) content is greater than 40%. Such composition was found to be associated with low dielectric constant.

In some embodiments, the copper diffusion barrier film stack is provided, at least in part, on a protective self-aligned buffer (PSAB) layer comprising material selected from the group consisting of $Cu_xSi_y$, $Cu_xP_y$, $Cu_xB_y$, $Cu_xGe_y$, $Cu_xAs_y$, $Cu_xC_y$, and copper chalcogenides (e.g., $Cu_xS_y$, $Cu_xSe_y$, $Cu_xTe_y$). The PSAB layer resides on top of copper metal of the copper lines and serves to promote adhesion between the diffusion barrier film and the copper line. The PSAB layers also reduce electromigration during end use of IC devices.

The PSAB layer material can be further doped in some embodiments with nitrogen or carbon. Further, in some embodiments, a chemical reaction may occur during the doping operation, in which the first formed PSAB layer, e.g., copper silicide layer is partially or completely chemically transformed. For example, the copper silicide layer may be transformed to copper metal impregnated with silicon nitride or silicon carbide. In this example, the PSAB layer may be viewed as a very thin layer of silicon nitride or silicon carbide, located at the top portion of a copper line on the interface with the diffusion barrier film. The PSAB layer typically has a graded composition, with the silicon nitride concentration decreasing as the distance from the diffusion barrier interface increases. Such blended composition of the PSAB capping layer promotes excellent adhesion between the copper line and the diffusion barrier film.

In another aspect, a semiconductor device comprising a metal interconnect formed substantially of copper and a copper diffusion barrier film above the metal interconnect is provided. The copper diffusion barrier film includes a layer of hermetic hydrogen doped carbon and a layer of hydrogen doped silicon carbide.

The copper diffusion barrier film is formed, at least in part, on a protective self-aligned buffer (PSAB) layer comprising material selected from the group consisting of $Cu_xSi_y$, $Cu_xP_y$, $Cu_xB_y$, $Cu_xGe_y$, $Cu_xAs_y$, $Cu_xS_y$, $Cu_xSe_y$, $Cu_xTe_y$, and $Cu_xC_y$, wherein the PSAB layer resides on a layer of copper. In some embodiments, the PSAB layer can be further doped with nitrogen or carbon, wherein doping may involve a chemical transformation (e.g., copper reduction).

In another aspect, a method of forming a copper diffusion barrier film in a semiconductor device is provided. The method includes the operations of receiving a semiconductor substrate with an exposed dielectric layer; forming a hermetic hydrogen doped carbon layer on at least a portion of the exposed dielectric layer; and forming a hydrogen doped silicon carbide layer on the hydrogen doped carbon layer, wherein together the hydrogen doped silicon carbide layer and the hydrogen doped carbon layer serve as the copper diffusion film.

In some embodiments the semiconductor substrate further comprises exposed copper lines or interconnects and the semiconductor substrate provides a substantially planar surface.

In some embodiments the method also includes an operation of forming a PSAB capping layer on at least some of the exposed copper lines or interconnects prior to operation deposition of the hermetic layer. The formation of the PSAB capping layer may include transforming a top portion of exposed copper by reacting copper atoms with a first reactant selected from the group consisting of $SiH_4$, $GeH_4$, $PH_3$, $B_2H_6$, $AsH_3$, $H_2S$, $H_2Se$, $H_2Te$, $CH_4$, and $C_xH_y$ to afford a layer of material selected from the group consisting of $Cu_xSi_y$, $Cu_xGe_y$, $Cu_xP_y$, $Cu_xB_y$, $Cu_xAs_y$, $Cu_xS_y$, $Cu_xSe_y$, $Cu_xTe_y$, and $Cu_xC_y$. In some embodiments, the layer of material selected from the group consisting of $Cu_xSi_y$, $Cu_xGe_y$, $Cu_xP_y$, $Cu_xB_y$, $Cu_xAs_y$, $Cu_xS_y$, $Cu_xSe_y$, $Cu_xTe_y$, and $Cu_xC_y$ is further treated with a second reactant selected from the group consisting of $N_2$, $NH_3$, $CH_4$, $C_2H_4$, $C_2H_2$, $C_xH_y$, a gas from the family of methyl-substituted silanes, a gas from the family of methyl-substituted amines and HMDS, to afford a material selected from the group consisting of nitrogen (N), carbon (C) or silicon (Si) doped $Cu_xSi_y$, $Cu_xGe_y$, $Cu_xP_y$, $Cu_xB_y$, $Cu_xAs_y$, and $Cu_xC_y$. Doping process may involve a chemical transformation of the first-formed PSAB layer, such as reduction of copper to copper metal and formation of a thin layer of $Si_xN_y$, $S_xC_y$, $Ge_xN_y$, etc., within the top portion of copper line.

In a particular embodiment the copper metal is reacted with $SiH_4$ to form $CuSi_x$ which is further treated with $NH_3$ plasma to form the PSAB layer that includes $Si_xN_y$. In this embodiment, conditions are adjusted so that $CuSi_x$ is partially or completely transformed to copper metal and silicon nitride.

PSAB layer can be formed, in some embodiments, by using a plasma enhanced chemical vapor deposition PECVD process. The PSAB layer can be formed at a temperature of less than about 300° C. Such low-temperature regime is advantageous in some embodiments, because higher temperatures may cause increased diffusion of copper silicide deeper into the copper line, thereby increasing its resistance.

Formation of hydrogen doped carbon layer can be performed by a PECVD process. According to some embodiments forming the hydrogen doped carbon layer includes providing the semiconductor substrate in a deposition chamber; exposing the substrate to a process gas comprising a hydrocarbon precursor gas having a partial pressure between about 0.01 and 4 Torr; and depositing the hydrogen doped carbon layer on at least a portion of the exposed dielectric layer by a PECVD process using a dual frequency RF (LF and HF) power in which LF:HF ratio is at least about 2:1. The process temperature used during deposition may range from about 30 to 300° C. In some embodiments, the process gas used for depositing the hydrogen doped carbon layer further comprises hydrogen gas and/or helium gas.

In some embodiments, the hydrogen doped silicon carbide layer is deposited using a PECVD. For example, a low-k hydrogen doped silicon carbide material with a carbon content of at least 40% can be deposited. In some embodiments, PECVD process uses a silicon carbide precursor selected from the group consisting of tetramethylsilane, ethynyltrimethylsilane, vinylphenylmethylsilane, phenyldimethylsilane, tri-iso-propylsilane, 3-(trimethylsilyl)cyclopentene, vinylphenyldimethylsilane, and vinyldimethylsilane. Yet in other embodiments the PECVD process uses a silicon carbide precursor selected from the group consisting of ethynyltrimethylsilane, vinylphenylmethylsilane, phenyldimethylsilane, tri-iso-propylsilane, 3-(trimethylsilyl)cyclopentene, vinylphenyldimethylsilane and vinyldimethylsilane. Yet in other embodiments, the PECVD process uses a silicon carbide precursor selected from the group consisting of ethynyltrimethylsilane, 3-(trimethylsilyl)cyclopentene, and vinyldimethylsilane.

In some embodiments it is preferable to use silicon carbide precursors with high carbon content. For example, in some embodiments a silicon carbide precursor having a composition with a C:Si molar ratio of at least 2:1, preferably at least 3:1 is used. The hydrogen-doped carbon layer and the hydrogen doped silicon carbide layer may each be deposited to a thickness ranging from about 10 to 10000 Å.

According to some embodiments, the diffusion barrier film may be deposited in a multi-station apparatus. For example, deposition of the hydrogen-doped carbon layer and of the hydrogen doped silicon carbide layer can be performed at different stations of a multi-station apparatus. In some embodiments formation of the PSAB layer and deposition of the hydrogen-doped carbon layer are performed in one station of a multi-station apparatus, while deposition of the hydrogen doped silicon carbide layer is performed at a different station of the multi-station apparatus.

These and other features and advantages of the present invention will be described in more detail below with reference to the associated drawings.

DETAILED DESCRIPTION OF A PREFERRED EMBODIMENT

Introduction and Overview

Figure 1A:
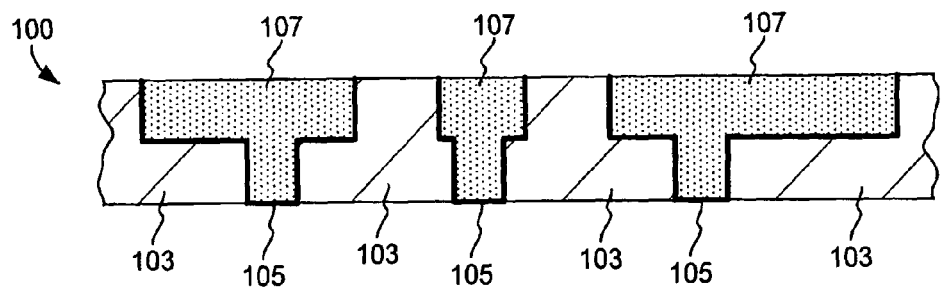
FIGS. 1A-1E show cross sectional depictions of device structures created during a copper dual Damascene fabrication process.

As it was mentioned, copper diffusion barrier films combining low dielectric constant with high hermeticity are described herein. "Low-k copper diffusion barrier films" are defined in this application as films having a dielectric constant value of less than about 4.0. These materials should not be confused with "low-k dielectrics", a term that is commonly used in the semiconductor industry to define IMD materials with a dielectric constant of less than about 3.0, which are typically carbon or fluorine doped silicon oxide based compounds.

Hermetic low-k films described herein compare favorably to previously known low-k diffusion barrier films (such as low-k SiC films) in that they hermetically adhere to an underlying substrate and protect it from atmospheric moisture and oxygen. Such protection is important both for underlying layers of dielectric and for underlying metal lines and interconnects.

When non-hermetic barrier layers are used, atmospheric moisture and oxygen can oxidize surfaces of metal lines and form metal oxide. This often leads to formation of voids within metal lines and to deterioration of electrical properties of metal interconnects. For example, oxidation of copper line surfaces to copper oxide leads to increased resistance of copper lines.

When a non-hermetic diffusion barrier layer resides on top of a low-k bulk dielectric layer, atmospheric moisture can penetrate through the barrier layer to a low-k IMD layer and can be absorbed into the bulk low-k dielectric, typically resulting in increase of the IMD's dielectric constant and shift of IMD's stress values.

Increase of the IMD's dielectric constant is, of course, an undesirable, since higher-k dielectric leads to a greater RC delay in the device.

It is therefore advantageous to prevent moisture absorption by a dielectric and atmospheric oxidation of metal lines by employing a hermetic low-k diffusion barrier layer deposited on top of exposed dielectric layers and exposed layers of metal. While it may be advantageous to employ a single material for such a layer, currently no individual low-k hermetic material that would satisfy integration requirements for a diffusion barrier layer is known.

It is herein provided that using a film that includes two layers, wherein one layer is hermetic and the other layer has a low dielectric constant, will result in good overall hermeticity and low effective dielectric constant. Materials and methods for forming such a film will be described in detail in the following sections.

According to some embodiments, the copper diffusion barrier film has a dielectric constant of less than about 4.0 (e.g., from about 3.0 to 4.0 or from about 3.5 to 4.0) as measured by methods known to those of skill in the art.

The hermeticity of such film is a measure of the moisture-barrier capability of a deposited film and may be measured by a tensile TEOS stress shift test, which will be briefly described.

In the TEOS stress shift test, the tested film is formed on a thick layer of tensile TEOS-deposited dielectric. The stress of the TEOS dielectric layer is measured before and after exposure to moisture with the difference of these two values being the tensile TEOS stress shift of the tested film. The lower the stress shift value of the tensile TEOS, the more hermetic is the tested film. Without a hermetic barrier layer, the stress of a tensile TEOS film will decrease dramatically during exposure to the atmosphere. For example, the stress of a tensile 5 kÅ TEOS film decrease from $10^9$ dynes/cm$^2$ to $-10^9$ dynes/cm$^2$ after approximately one week of exposure to the atmosphere—a decrease of over 100%. Capping the tensile TEOS films with a hermetic film results in a stress change in a tensile TEOS of less than 10% after one week of exposure time. In some embodiments, a Pressure Cooker TEOS test is used to assess the hermeticity of the film. In this test each tested film is deposited on top of a thick tensile TEOS film, the TEOS film typically having a thickness of 500 nm with stress of $2.4 \cdot 10^9$ dynes/cm$^2$. The barrier film/TEOS stack is exposed to water vapor at 120° C. and 2 atm pressure for 10 hours. The stress drift of the film stack is then measured. In certain embodiments, the hermetic films described herein exhibited tensile TEOS stress shifts of less than 10 MPa as measured by the Pressure Cooker test.

While hermetic low-k films described herein will be primarily referred to as "copper diffusion barrier films", it is understood that they can be used in a number of applications in IC fabrication, including use as etch stop films, CMP stop films, intermediate etch stop films and other hardmasks. These films may or may not serve as copper diffusion barriers depending on their location within the IC device.

While applications of low-k hermetic films will be primarily illustrated in the context of IC device formation performed by Damascene processing, it should be understood that such films may be utilized in other IC fabrication methods and may also find applications outside of semiconductor industry.

Damascene processing is a method for forming interconnections on integrated circuits. It involves formation of inlaid metal lines in trenches and vias formed in a dielectric layer (inter-metal dielectric). In order to frame the context of this invention, a brief description of a copper dual Damascene process for forming a partially fabricated integrated circuit is described below. As it has been noted, the invention applies to other fabrication processes including single Damascene processes.

Presented in FIGS. 1A-1D, is a cross sectional depiction of device structures created on a semiconductor substrate at various stages of a dual Damascene fabrication process. A cross sectional depiction of a completed structure created by the dual Damascene process is shown in FIG. 1E. "Semiconductor substrate" as used in this application is not limited to the semiconductor portions of an IC device, but is broadly defined as a semiconductor-containing substrate, which includes IC structures (e.g., conductors and insulators) residing upon semiconductor material. Referring to FIG. 1A, an example of a partially fabricated IC structure, 100, used for dual Damascene fabrication is illustrated. Structure 100 as illustrated in FIGS. 1A-1D is part of a semiconductor substrate, and, in some embodiments, may directly reside on a semiconductor layer containing active devices, such as transistors. In other embodiments, it may directly reside on a metallization layer or other layers that incorporate conductive materials, e.g., layers containing memory capacitors.

A layer 103 illustrated in FIG. 1A is a layer of inter-metal dielectric, which may be silicon dioxide but is more typically a low-k dielectric material. In order to minimize the dielectric constant of the IMD stack, materials with a k value of less than about 3.5, preferably less than about 3.0 and often as low as about 2.8 are employed as inter layer dielectrics. These materials include but are not limited to fluorine or carbon doped silicon dioxide, organic-containing low-k materials and porous doped silicon dioxide materials known to those of skill in the art. Layer 103 is etched with line paths (trenches and vias) in which a partially conductive metal diffusion barrier 105 (such as Ta, $Ta_xN_y$ or a $Ta/Ta_xN_y$ bilayer) is deposited followed by inlaying with copper conductive routes 107. Because copper or other mobile conductive material provides the conductive paths of the semiconductor substrate, the underlying silicon devices and dielectric layers proximate to metal lines must be protected from metal ions (e.g., $Cu^{2+}$) that might otherwise diffuse or drift into the silicon or ILD and result in degradation of their properties. Several types of metal diffusion barriers are used in order to protect the dielectric layers of the IC device. These types may be divided into partially conductive metal-containing layers such as 105 and non-conductive barrier layers which will be described in further detail with reference to FIG. 1B. Suitable materials for partially conductive diffusion barrier 105 include materials, such as tantalum, tantalum nitride, titanium, titanium nitride and other materials known to those of skill in the art. These are typically deposited onto a dielectric layer having vias and trenches by a PVD method. Typical metals for the conductive routes are aluminum and copper. More frequently, copper serves as the metal in Damascene processes, as depicted in these figures. Copper lines 107 can be deposited by electrochemical processes, with excess copper being subsequently removed from the field during planarization operation, such as CMP. The resultant partially fabricated integrated circuit 100 is a representative substrate for subsequent Damascene processing, as depicted in FIGS. 1B-1E.

Figure 1B:
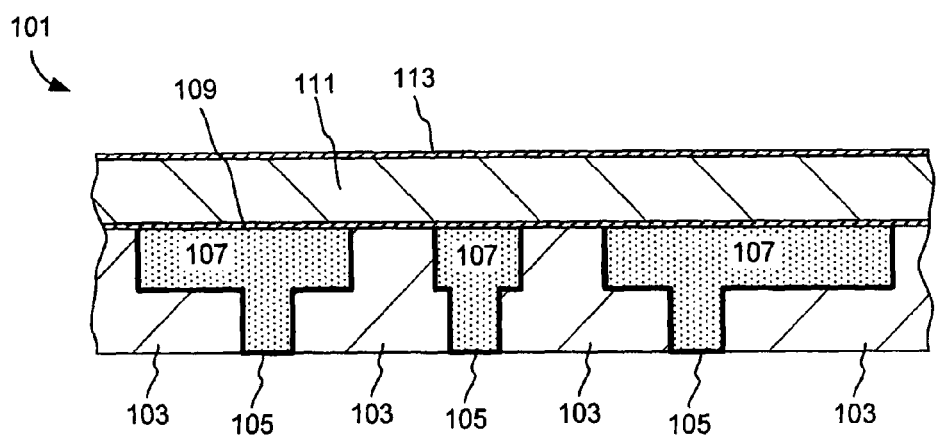

As depicted in FIG. 1B, a diffusion barrier film 109 is deposited to encapsulate conductive routes 107. This film may also serve as an etch stop during subsequent Damascene processing. In contrast to partially conductive barrier 105, film 109 should be non-conductive and should preferably have a low dielectric constant. Preferably materials with a dielectric constant of less than about 4.0, e.g., with a dielectric constant of 3.5-4.0 or even lower, such as about 3.2 or about 3.0, should be used. At the same time this layer should preferably be hermetic and should be capable of protecting the underlying dielectric layer 103 and copper lines 107 from atmospheric moisture and oxygen. Film 109 should also effectively prevent diffusion of metal into the dielectric layer and should provide etch selectivity when used as an etch stop. Conventionally, SiN, and nitrogen-doped silicon carbide (NDC) were used for this application. The present invention provides a film with a dielectric constant that is substantially lower than the k values of SiN and NDC and with hermeticity that is well suited for this application. This film can be deposited on a semiconductor substrate having exposed layers of dielectric and exposed metal lines by, for example, plasma enhanced chemical vapor deposition (PECVD). Preferably, PECVD having a low frequency plasma component, provided by low frequency radio-frequency (LF RF) power source, is used.

Referring again to FIG. 1B, a first dielectric layer, 111, of a dual Damascene dielectric structure is deposited on a diffusion barrier 109. This is followed by deposition of an etch stop film 113 by a PECVD method on the first dielectric layer 111. In this case the film 113 is deposited on a surface of dielectric 111 that does not include exposed metal lines. The dielectric layer 111 is typically composed of low-k dielectric materials such as those listed for a dielectric layer 103. Note that layers 111 and 103 need not necessarily have identical composition. Similarly, etch stop layer 113 is preferably a hermetic low-k bi-layer film, but need not necessarily have an identical composition to layer 109.

Figure 1C:
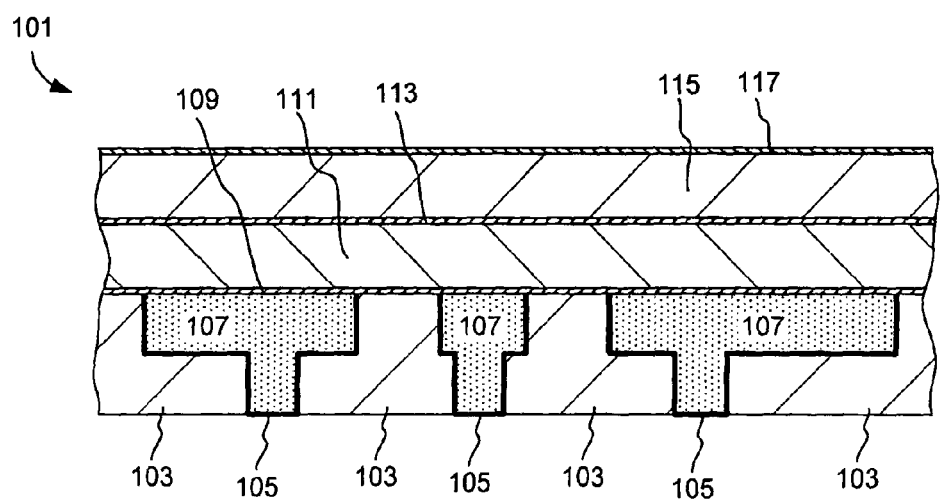

The process follows, as depicted in FIG. 1C, where a second dielectric layer 115 of the dual Damascene dielectric structure is deposited in a similar manner to the first dielectric layer 111, onto etch-stop film 113. Deposition of an antireflective layer (not shown) and a CMP stop film 117 follows. Second dielectric layer 115 is typically a low-k dielectric material such as those described above for layers 103 and 111. A CMP stop film 117 serves to protect the delicate dielectric material of IMD layer 115 during subsequent CMP operations. Typically, a CMP stop layer is subject to similar integration requirements as diffusion barrier and etch stop films 109 and 113, and can similarly be composed of a hermetic low-k bi-layer. While it is advantageous to utilize hermetic low-k films for the diffusion barriers and hard masks (e.g., etch and CMP stop) of the IC structure, it should be realized that in certain embodiments, at least some of these layers may be composed of materials known in the art, such as silicon nitride, silicon carbide, oxygen doped silicon nitride (e.g., silicon oxynitride) and the like.

Figure 1D:
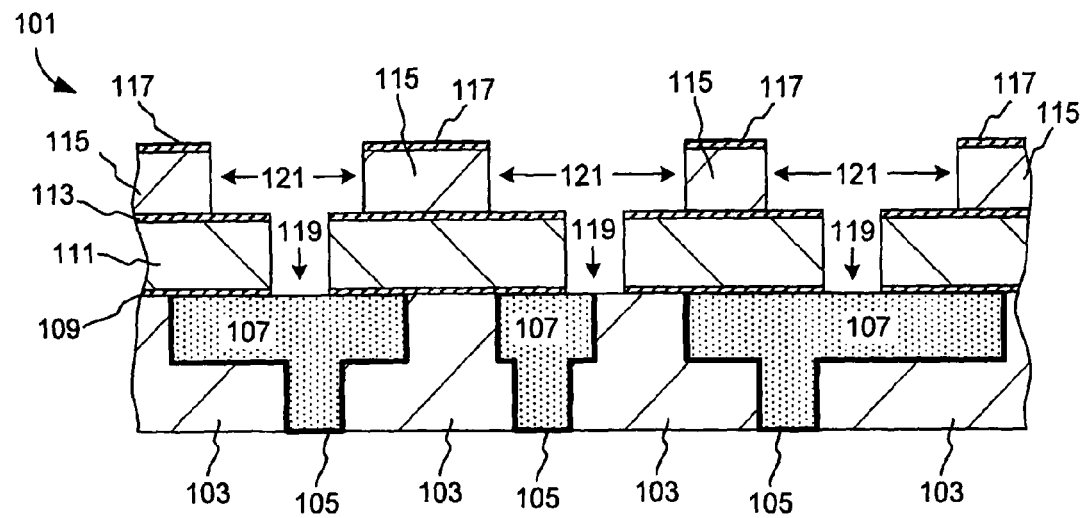
Figure 1E:
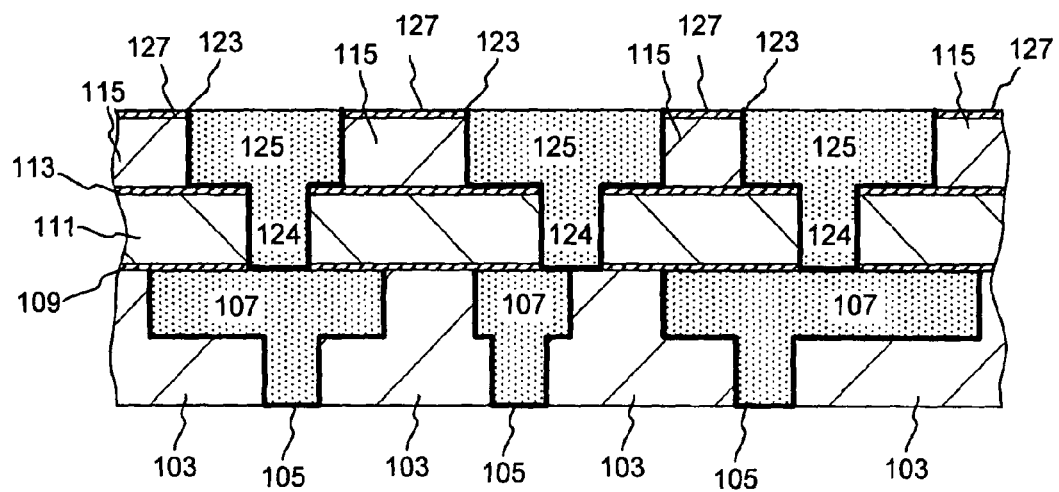

The dual Damascene process continues, as depicted in FIGS. 1D-1E, with etching of vias 119 and trenches 121 in the first and second dielectric layers. Standard lithography techniques are used to etch a pattern illustrated in FIG. 1D. A trench-first or a via-first methods well known by those of skill in the art may be employed.

Next, as depicted in FIG. 1E, these newly formed vias and trenches are, as described above, coated with a metal diffusion barrier 123. As mentioned above, barrier 123 is made of tantalum, or other materials that effectively block diffusion of copper atoms into the dielectric layers.

After diffusion barrier 123 is deposited, a seed layer of copper is applied (typically a PVD process) to enable subsequent electrofilling of the features with copper inlay. Excess of metal deposited in the field is removed in a CMP operation, performed such that CMP stops at the CMP stop film 117. FIG. 1E shows the completed dual Damascene process, in which copper conductive routes 124 and 125 are inlayed (seed layer not depicted) into the via and trench surfaces over barrier 123.

As it was mentioned, low-k hermetic films are most suited for use in the etch-stop, CMP-stop and barrier layers, such as layers 109, 113, and 127 depicted in FIG. 1E. Each of these films may have a thickness of about 10-10000 Å, preferably 50-2000 Å. A structure of such films will be discussed in the following section with reference to FIGS. 2A and 2B.

Copper Diffusion Barrier Films

Copper diffusion barrier or etch stop film is typically deposited onto a semiconductor substrate having an exposed portion of dielectric layer. In some embodiments, the substrate may also have an exposed layer of metal, such as layer of copper. In other embodiments, the metal lines in a semiconductor substrate may be capped with protective material, and diffusion barrier or etch stop film is deposited on top of exposed portions of such capping materials as well as on top of exposed dielectric portions.

Figure 2A:
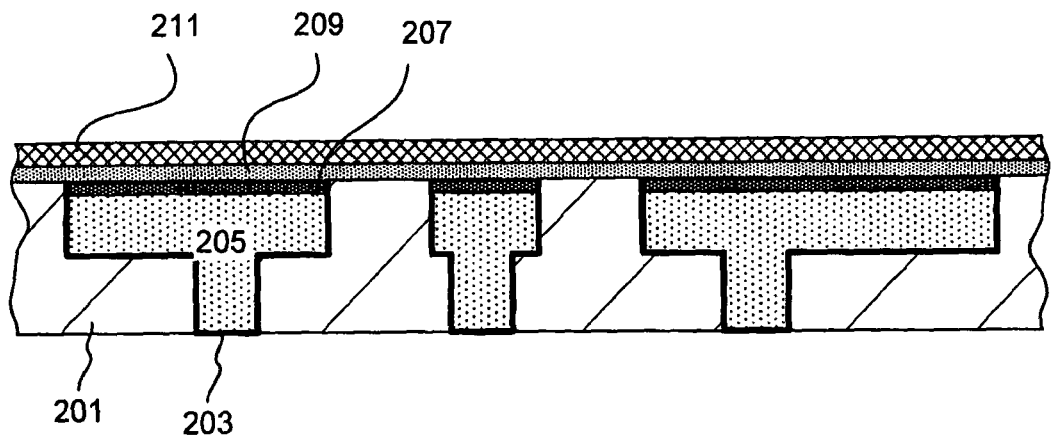
FIG. 2A is a cross sectional depiction of a partially fabricated device structure showing PSAB layer and copper diffusion barrier bi-layer film in accordance with some embodiments of present invention.

Referring to FIG. 2A, a cross sectional depiction of a partially fabricated IC device is shown. In a bulk layer of IMD, 201 reside inlaid copper lines 205 which are separated from the bulk IMD layer 201 by a layer of partially conductive diffusion barrier 203 (typically composed of such materials as Ta, $TaN_x$, or $Ta/TaN_x$ bi-layer). Within the upper portion of copper lines 205, a protective capping layer 207 is formed. Such protective layers, which are referred to as protective self-aligned buffer (PSAB) layers are described in detail in U.S. application Ser. No. 10/980,076 titled "Protection of Cu Damascene Interconnects by Formation of a Self-Aligned Buffer Layer" which was filed on Nov. 3, 2004 and which is herein incorporated by reference in its entirety. The PSAB layer 207 serves to promote adhesion between the copper layer and the diffusion barrier film as well as to protect copper metal from inadvertent oxidation and also to reduce electromigration of copper.

Suitable materials for PSAB layers include $Cu_xSi_y$, $Cu_xP_y$, $Cu_xB_y$, $Cu_xGe_y$, $Cu_xAs_y$, $Cu_xS_y$, $Cu_xSe_y$, $Cu_xTe_y$, and $Cu_xC_y$, wherein each of these materials can be further doped with nitrogen (N) or carbon (C). In some embodiments, doping may involve a chemical transformation of a first formed PSAB layer. For example, $Cu_xSi_y$ may be partially or completely converted to copper metal during the doping process, while formation of a self-aligned layer of silicon nitride or silicon carbide simultaneously occurs. In one example, PSAB layer includes a thin layer of silicon nitride impregnated into the top portion of a copper line at the interface with the copper diffusion barrier film. Typically such PSAB layer has a graded composition with concentration of silicon nitride gradually decreasing as the distance from the diffusion barrier interface increases. Such graded composition is particularly beneficial for improved adhesion between the copper and the diffusion barrier film. In certain embodiments, the PSAB layer may comprise several layers with graded composition. For example a layer of silicon nitride may reside on top of a layer of $Cu_xSi_y$. As used herein PSAB layer definition includes any layer or layers (with graded composition or distinct boundary) with a composition as described above, which is self-aligned with copper lines in which it resides, such that PSAB layers do not extend over dielectric field regions. In some embodiments, PSAB layers do not extend substantially above the layer of bulk dielectric to which are they are adjacent, that is in these embodiments top surfaces of PSAB layer and of adjacent IMD layer are substantially at the same level. PSAB layer may have a thickness ranging from about 10 to about 1000 Å. At current levels of miniaturization, PSAB layers with a thickness ranging from about 20 to 100 Å are employed.

The hermetic low-k copper diffusion barrier film resides on top of PSAB layer 207 and IMD layer 201. It is understood, that the PSAB layer may not be needed in some embodiments, and diffusion barrier film may be deposited directly on a substrate having exposed copper surfaces. Referring again to FIG. 2A, the diffusion barrier film includes a bottom layer 209, which imparts increased hermeticity to the film and a top layer 211 which has a low dielectric constant.

It was unexpectedly discovered that hydrogen-doped carbon having a particular structure that can be characterized in some embodiments by high density and high $sp^3$ carbon content, provides a hermetic layer that is capable of protecting the underlying dielectric and conductive layers from atmospheric moisture, without substantially sacrificing other diffusion barrier integration requirements. The hydrogen doped carbon layer has a composition of $C_xH_y$ and in some cases may include small amounts of other dopants. In some embodiments, this material is characterized by carbon content of about 50-80 molar % and density value of at least about 1.3 g/mL. Ratio of $sp^3$ carbon to $sp^2$ carbon, as determined by Fourier Transform Infrared Spectroscopy (FTIR) in this material is typically greater than about 1:1, preferably greater than about 2:1, for example between about 2:1 and 10:1. Such vitreous dense carbon effectively seals the underlying layers from atmospheric exposure, leading to improved stability of underlying structures. Hermeticity of this material is characterized by a tensile TEOS stress shift of less than about 10 MPa, and in some cases less than about 7 MPa. It is, of course, preferable that dielectric constant of such hermetic material is minimized. Hermetic carbon materials having a dielectric constant of about 4.2 were obtained. Generally, it is preferable to use hermetic carbon materials with a dielectric constant of less than about 4.5. This material and its methods of formation are described in detail in commonly assigned U.S. application Ser. No. 11/710,377 titled "Methods of Depositing Stable and Hermetic Ashable Hardmask Films" filed Feb. 22, 2007, which is herein incorporated by reference in its entirety. While a single layer of carbon material may be suitable for some applications, for other applications its dielectric constant is considered to be too high and should be further minimized.

It is herein provided that effective dielectric constant of copper diffusion barrier film can be minimized by stacking a layer of low-k silicon carbide 211 on top of a layer of hermetic hydrogen doped carbon 209. Preferably, dielectric constant of low-k silicon carbide layer 211 is less than about 4.0, and even more preferably less than about 3.5. Effective dielectric constant of such stack will be determined by relative thicknesses of layers 209 and 211 and will be lower than the dielectric constant of the carbon layer alone, while the hermeticity of the bi-layer film will be determined by the hermetic properties of the bottom carbon layer 209. Depending on particular application and properties of materials used, thicknesses of layers 209 and 211 can vary from about 10-10000 Å, preferably from about 50 to 2000. Preferably the resulting bi-layer diffusion barrier film will have an effective dielectric constant of less than about 4.0 and hermeticity, defined by tensile TEOS stress shift of less than about 10 MPa.

A number of low-k silicon carbide materials can be used for the top layer 211. Hydrogen doped silicon carbide materials having dielectric constant of less than about 3.5 are described in detail in U.S. patent application Ser. No. 10/869,474 titled "Low-K SiC Diffusion Barrier Films" by Yu et al., filed on Jun. 15, 2004, which is incorporated herein by reference. Such low-k hydrogen doped silicon carbide is characterized by a composition $Si_xC_yH_z$ with high carbon content. For example, the material can have carbon content of at least 40 atomic % (e.g., between about 45 and 60% carbon). Further, such high carbon-content layer may have a composition, wherein the ratio of C to Si is greater than 2:1; or >3:1; or 4:1; or 5:1. In some embodiments, hydrogen doped silicon carbide (or precursor used for its deposition) may include unsaturated carbon-carbon bonds, such as double bonds, triple bonds and aromatic bonds or derivatives of such bonds (e.g., the silicon carbide material can have high level of methylene bridging or other types of cross-linking). Examples of such hydrogen doped silicon carbide materials and methods of their deposition are described in detail in U.S. Pat. No. 6,855,645 titled "Silicon Carbide Having Low Dielectric Constant" by Tang et al., issued on Feb. 15, 2005, which is herein incorporated by reference.

Other types of low-k silicon carbide materials include low-k boron-doped silicon carbide and oxygen-doped silicon carbide. In some embodiments, low-k boron doped silicon carbide is further doped with nitrogen and has a composition $Si_xC_yH_zB_wN_q$ or $Si_xC_yB_wN_q$. In other embodiments, low-k boron-doped silicon carbide is nitrogen-free and is characterized by high carbon content of at least about 40% with a general formula $Si_xC_yH_zB_w$ and $Si_xC_yB_w$. It is often advantageous to use nitrogen-free boron doped silicon carbide, since doping with BN is typically associated with increased moisture uptake by the barrier layer resulting in increase of dielectric constant. Low-k boron-doped materials and methods of their deposition are described in detail in U.S. Pat. No. 6,967,405 titled "Film for Copper Diffusion Barrier" issued on Nov. 22, 2005 to Yu et al. and in U.S. patent application Ser. No. 10/915,117 titled "Low-k B-doped SiC Copper diffusion Barrier Films" filed on Aug. 9, 2004 naming Yu et al. as inventors, which are both incorporated herein by reference in their entirety.

Yet another type of low-k silicon carbide includes low-k oxygen doped silicon carbide with a general formula $Si_xC_y\text{-}H_zO_q$. In some embodiments such silicon carbide includes unsaturated carbon-carbon bonds (e.g., double or triple bonds) or their derivatives. Low-k oxygen doped silicon carbide and methods of its deposition are presented in U.S. Pat. No. 6,855,645 titled "Silicon Carbide Having Low Dielectric Constant" by Tang et al., issued on Feb. 15, 2005 previously incorporated by reference.

In some embodiments, in addition to low-k silicon carbide layer 211, the copper diffusion barrier film may include additional layers (not shown) modulating properties of the film. A variety of layers can be included in a stack provided that they do not increase effective dielectric constant of the film above about 4.0. For example, in addition to bottom hermetic carbon layer, a top bi-layer of nitrogen-doped silicon carbide and hydrogen-doped silicon carbide can be included in the film, thus forming a tri-layer stack. In another example, a top bi-layer of oxygen-doped silicon carbide and hydrogen-doped silicon carbide can be included. Advantages associated with such stacks and methods of forming stacks of silicon carbide having low dielectric constant (preferably less than about 3.5) are discussed in U.S. patent application Ser. No. 10/869,474 previously incorporated by reference.

Figure 2B:
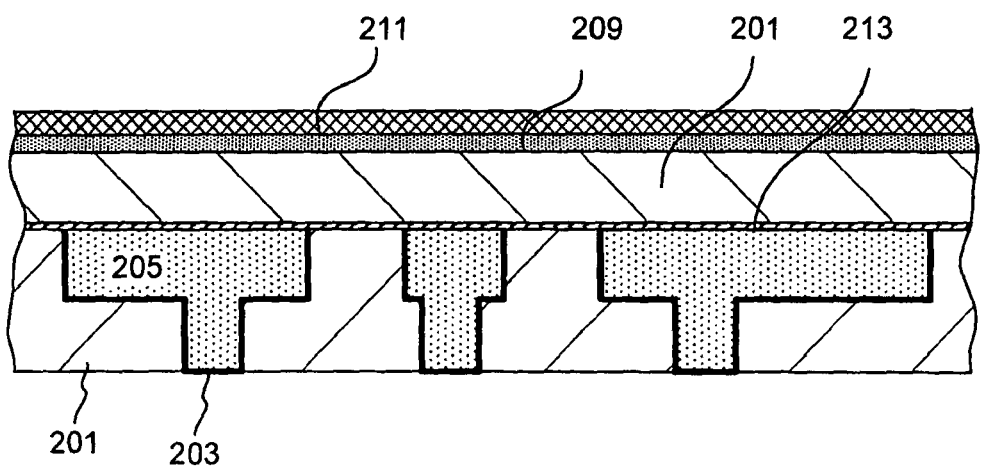
FIG. 2B is a cross sectional depiction of a partially fabricated device structure showing a bi-layer film formed on top of a layer of dielectric material in accordance with some embodiments of present invention.

In some embodiments, a copper diffusion barrier, etch stop film or CMP stop film is deposited on a substrate that has exposed layers of dielectric but does not have exposed copper layers. For example, this may occur during deposition of an intermediate etch stop layer 113, or a CMP stop layer 117 shown in FIG. 1C. Referring to FIG. 2B, a cross-sectional side view of a partially fabricated IC device is shown. FIG. 2B illustrates the structure of an etch stop, CMP stop or copper diffusion barrier film analogous to films 113 and 117 deposited on top of exposed layer of dielectric. These films include a hermetic layer 209 and a low-k layer 211 having structural characteristics as described above.

Methods of forming such copper diffusion barrier films and methods of forming PSAB copper capping layers will be described in the following section.

Methods of Depositing Copper Diffusion Barrier Films

Methods of depositing copper diffusion barrier films will be illustrated with an example process flow that uses a substrate having an exposed layer of dielectric and an exposed layer of copper. As mentioned above, in other embodiments, the substrate may not necessarily include exposed metal layers. In both cases similar methods for depositing the hermetic layer and the low-k layer components of the diffusion barrier film stack can be used.

Figure 3:
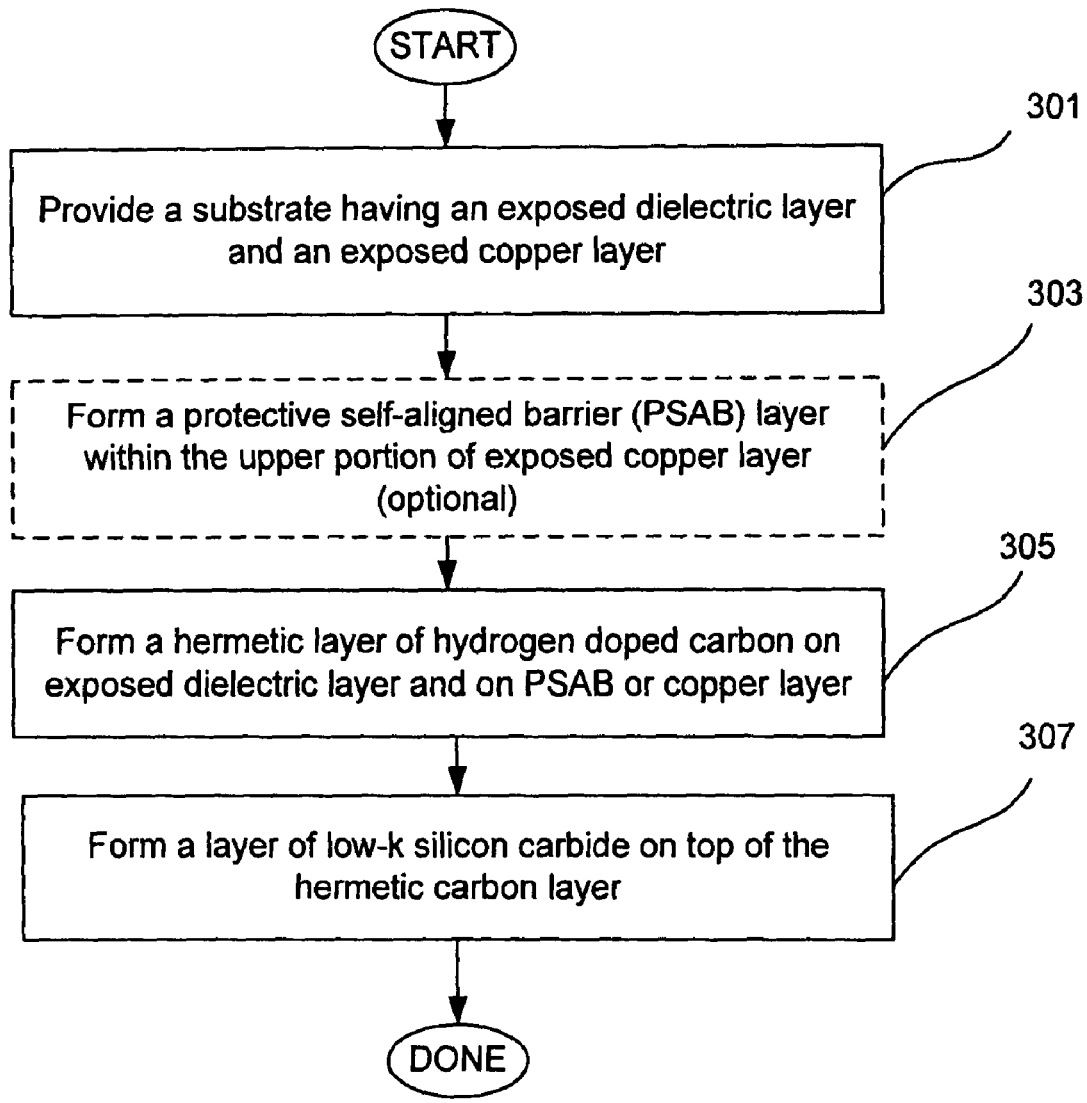
FIG. 3 presents an example process flow diagram for depositing a PSAB layer and copper diffusion barrier film.
Figure 4A:
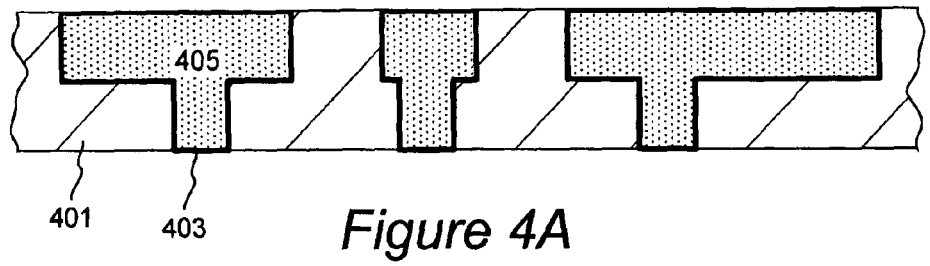
FIGS. 4A-4D present cross sectional depictions of partially fabricated device structures during various stages of deposition of PSAB layer and copper diffusion barrier film.

Copper diffusion barrier and etch stop films can be formed according to the process illustrated in FIG. 3. The process starts with an operation 301, in which a substrate having an exposed dielectric layer and an exposed copper layer is provided. A cross-sectional depiction of an example substrate is presented in FIG. 4A. Substrate illustrated in FIG. 4A includes a layer of dielectric 401 having inlaid copper lines 405, which are separated from the dielectric layer by a thin layer of partially conductive copper diffusion barrier material such as Ta or TaN. Top portions of dielectric layer 401 and copper lines 405 are exposed. Such substrate can be obtained during IC fabrication as described with reference to FIG. 1A. Typically such substrate is obtained after copper electrodeposition and subsequent CMP operation serving to planarize top portion of substrate and to remove copper.

After the substrate has been provided, formation of PSAB layer will follow in an operation 303. PSAB layer serves to reduce the possibility of copper surface oxidation during IC fabrication and also to minimize electromigration of copper during the end use of the IC device. It also improves adhesion between copper and the diffusion barrier film. Adhesion is particularly improved in the case, when low-k materials are used in copper diffusion barrier films While in some embodiments, formation of PSAB layer may not be needed and copper diffusion barrier layer may be deposited on a substrate having unmodified exposed copper surfaces, in other embodiments it is preferred to modify top portions of copper layers with protective self-aligning buffer caps PSAB Layer Formation Formation of the PSAB layers has been described in detail in U.S. application Ser. No. 10/980,076, previously incorporated by reference. As used herein, PSAB layer can be composed of $Cu_xSi_y$, $Cu_xP_y$, $Cu_xB_y$, $Cu_xGe_y$, $Cu_xAs_y$, $Cu_xS_y$, $Cu_x\text{-}Se_y$, $Cu_xTe_y$, and $Cu_xC_y$ materials, wherein each of these materials can be further doped with nitrogen (N) or carbon (C). Doping may involve a chemical transformation of a first formed PSAB layer as described above. In some embodiments, PSAB layer is a thin layer $Si_xN_y$ residing within the upper portion of copper line. PSAB layers are deposited selectively within the copper lines, so that the PSAB layer does not extend over dielectric field regions. In some embodiments, PSAB layers do not extend substantially above the layer of bulk dielectric to which they are adjacent, that is in these embodiments top surfaces of PSAB layer and of adjacent IMD layer are substantially at the same level. PSAB layers can be selectively formed within the top portions of the copper lines by introducing a reactant that will react with copper or that will decompose in a copper-catalyzed process under conditions that would not promote deposition of any material elsewhere on the wafer.

PSAB layer formation is preferably performed in a closed environment under a continuous vacuum such that the copper layer 405 is not exposed to the ambient environment containing moisture or oxygen. For example, appropriate vacuum conditions suitable for PSAB formation can be created in CVD or PECVD apparatuses. Specifically, multi-station PECVD processing tools, such SEQUEL® and VECTOR® tools commercially available from Novellus Systems, Inc. located in San Jose, Calif., can be employed. In some embodiments, PSAB layer formation is performed at one station of a multi-station PECVD or CVD tool, with other stations being reserved for deposition of copper diffusion barrier film.

In a typical PECVD process, the substrate is provided to a deposition chamber within a PECVD apparatus. The surface of the substrate may be optionally pre-cleaned by, for example, RF plasma cleaning to remove copper oxide or contaminants that may remain on the substrate surface after CMP operation. In some embodiments, pre-cleaning is performed by flowing hydrogen ($H_2$) or ammonia ($NH_3$) into the process chamber, igniting a plasma discharge and treating the substrate with these gases in a plasma discharge. Pre-cleaning can be performed at a temperature ranging from about 20° C. to about 500° C., preferably from about 200° C. to about 300° C., and more preferably from about 225° C. to about 275° C. Pressure may range from about 10 mTorr to about 100 Torr, and a plasma may be generated at a power range of about 1 Watt to about 1000 Watts per processing station. Gases can be flown into the process chamber at a flow rate ranging from about 0.001 sccm to about 10000 sccm, more typically from about 1 sccm to about 10000 sccm.

Following the pre-clean, the substrate is pre-heated (if required) to a temperature ranging from about 20° C. to about 500° C. and is then exposed to PSAB process gas that includes one or more reactant gases.

The reactant gas or vapor is provided to the processing chamber at a flow rate ranging from 0.001 sccm to about 10000 sccm, preferably from about 1 sccm to about 100 sccm, and under temperatures ranging from about 20° C. to about 500° C., preferably from about 200° C. to about 300° C., and more preferably from about 225° C. to about 275° C. Pressure may range from about 10 mTorr to about 100 Torr. and a power range of about 1 Watt to about 1000 Watts per processing station. The reactant gas or vapor may include, but is not limited to $SiH_4$, $GeH_4$, $PH_3$, $B_2H_6$, $AsH_3$, $H_2S$, $H_2Se$, $H_2Te$, and $CH_4$, or any hydrocarbon reactant of the formula $C_xH_y$, and the like. Mixtures of these gases may be used in some embodiments. Under conditions provided above copper atoms of the top portion of the exposed copper lines react with the introduced gases to form a PSAB layer. For example treating the substrate with $SiH_4$ under these conditions will result in formation of $Cu_xSi_y$ layer. It should be noted that in certain embodiments, plasma discharge should not be ignited when the substrate is treated with the above listed reactants. In the absence of plasma discharge, no blanket deposition of material will occur across the field regions of the wafer. As desired, only the top portions of copper lines would be modified by selective reaction of these gases at the copper surface.

In certain embodiments it is important to perform PSAB layer deposition in a particular temperature regime. For example formation of $Cu_xSi_y$ PSAB layer is optimized in the temperature range of about 225-275° C. In some embodiments deposition at lower temperatures may not result in an appreciable reaction rate, while deposition at higher temperatures may lead to high rates of diffusion of copper silicide into the body of the via, thereby unnecessarily increasing the thickness of the PSAB layer and, consequently, resistance of the via chain.

In some embodiments, after the first PSAB layer has been deposited as described above, the PSAB layer is subjected to a "pinning" operation, which is referred to in the U.S. application Ser. No. 10/980,076 previously incorporated by reference as a deposition of a dielectric cap. In these embodiments, the PSAB layer is formed sequentially by first contacting the substrate with the first reactant gas such as $SiH_4$, $GeH_4$, $PH_3$, $B_2H_6$, $AsH_3$, $H_2S$, $H_2Se$, $H_2Te$, $CH_4$, or any hydrocarbon reactant of the formula $C_xH_y$, and the like, followed by contacting the substrate with a second reactant gas or gaseous mixture which may include $N_2$, $NH_3$, $CH_4$, $C_2H_4$, $C_2H_2$, $C_xH_y$, a gas or gaseous mixture from the family of methyl-substituted silanes, such as $SiH_x(CH_3)_{4-x}$, a gas or gaseous mixture from the family of methyl-substituted amines, such as $NH_x(CH_3)_{3-x}$, and hexamethyldisilazane (HMDS). Typically during the introduction of the second reactant gas, the plasma discharge is ignited, and a reaction occurs between the first-formed PSAB layer and the reactant gas. The deposition conditions used during this pinning operation are typically similar to those described above. The reactant gas or vapor is provided to the processing chamber at a flow rate ranging from 0.001 sccm to about 10000 sccm, preferably from about 1 sccm to about 100 sccm, and under temperatures ranging from about 20° C. to about 500° C., preferably from about 200° C. to about 300° C., and more preferably from about 225° C. to about 275° C. Pressure may range from about 10 mTorr to about 100 Torr, and a power range of about 1 Watt to about 1000 Watts per processing station.

When such sequential approach of forming PSAB layers is used, a PSAB bi-layer, such as $Cu_xSi_y$/SiN bi-layer may be obtained, wherein the composition between layers may gradually change. In some embodiments, a dielectric cap or a pin is essentially formed within the first formed PSAB layer, forming essentially one layer. In some embodiments, the first formed $Cu_xSi_y$ is partially or completely converted to copper metal impregnated with silicon nitride during the pinning step. The formation of a dielectric cap is often referred to as pinning because this operation serves to localize PSAB layer within the upper portion of the metal line. Often, during formation of the first-formed PSAB layer, excess of elemental silicon is generated upon silane decomposition on copper surfaces. Silicon readily diffuses into the copper lines, increasing via chain resistance. Pinning step converts silicon and, in part, copper silicide, to silicon nitride and prevents undesired diffusion of silicon into the via. As a result, in some embodiments, a thin layer of silicon nitride is formed within the upper portions of copper lines at the interface with the diffusion barrier layer.

Alternative methods of depositing PSAB layers, such as adsorption-based deposition methods are described in detail in U.S. application Ser. No. 10/980,076 previously incorporated by reference.

Figure 4B:
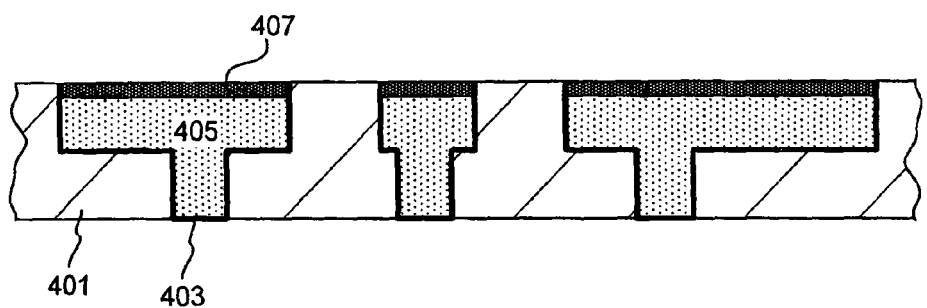

FIG. 4B presents a cross-sectional depiction of a partially fabricated IC device having PSAB layer 407 formed within the top portion of copper line 405. The structure presented in FIG. 4B is used as a substrate for the subsequent copper diffusion barrier deposition.

While PSAB layer is not essential for further deposition of a copper diffusion barrier film, it promotes adhesion between the barrier layer and the underlying copper. This advantage is particularly substantial when carbon-rich low-k diffusion barrier films are used, that may otherwise have poor adhesion to copper lines.

Hermetic Layer Formation

Referring again to the process flow diagram presented in FIG. 3, a hermetic layer of hydrogen doped carbon is formed on top of exposed dielectric layer and on top of exposed PSAB layer in an operation 305. The resulting structure having a hermetic layer 409 residing on top of ILD layer 401 and on top of PSAB layer 407.

Methods of forming a hermetic hydrogen doped carbon layer are described in detail in a commonly assigned co-pending U.S. application Ser. No. 11/710,377, previously incorporated by reference, which describes using this material in an ashable hardmask application.

The hermeticity of hydrogen doped carbon was found to be influenced by deposition conditions in an unexpected manner. According to some embodiments, the layer of hydrogen doped carbon exhibiting high hermiticity is deposited under plasma discharge conditions in a PECVD apparatus using a low partial pressure of a hydrocarbon precursor. Further, in some embodiments, a dual-frequency PECVD process employing a low frequency (LF) power and high frequency (HF) power with increased amount of LF power component results in formation of highly hermetic and stable hydrogen doped carbon films. This is believed to occur in part due to increased ion bombardment and densification of the deposited film, associated with LF power plasma component. According to certain embodiments, the use of both low hydrocarbon precursor partial pressure and high LF power facilitates the deposition of hermetic films.

Highly hermetic hydrogen-doped carbon films are characterized by high $sp^3$ carbon content and high density. It should be understood that traditionally used carbon film deposition processes typically resulted in formation of $sp^2$-carbon rich films having poor hermetic characteristics. For example at typical PECVD operating regimes, the carbon films are dominated by $sp^2$ bonding (e.g., $sp^3$:$sp^2$ ratio of around 1:3.5). In certain embodiments, the methods provided herein increase $sp^3$ content, e.g. so that $sp^3$:$sp^2$ ratio is around 1:1 or greater.

In a typical process of depositing a hermetic layer, a substrate having exposed layer of dielectric, such as a partially fabricated IC device depicted in FIG. 4B, is provided into the deposition chamber of a PECVD apparatus. Preferably, such apparatus should have a low frequency power source. Examples of such PECVD tools include SEQUEL® and VECTOR® tools. Preferably, atmospheric exposure is avoided between PSAB deposition and hermetic layer deposition. In some embodiments, hermetic layer deposition is performed in the same station of the multi-station tool as the formation of the PSAB layer and under the same or similar temperature regime. For example, both PSAB layer formation and hermetic layer deposition can be performed at a temperature range of between about 225 and 275° C.

After the semiconductor device substrate has been provided to a deposition chamber, a process gas comprising a hydrocarbon precursor gas is introduced to the chamber. In certain embodiments, the hydrocarbon precursor is introduced at low partial pressure, e.g. between about 0.01-4 torr. In certain embodiments, the partial pressure is at or below about 0.2 torr.

The hydrocarbon precursor may be, for example, one defined by the formula $C_xH_y$, wherein X=2 to 10 and Y=2-22. Specific examples include methane, acetylene, ethylene, propylene, butane, cyclohexane, benzene and toluene and ($CH_4$, $C_2H_2$, $C_2H_4$, $C_3H_6$, $C_6H_6$, $C_6H_6$, $C_6H_{12}$ and $C_7H_8$, respectively). Acetylene is a preferred precursor in many applications.

A carrier gas may be used to dilute the precursor flow. The carrier gas may be any suitable carrier gas, including helium, argon, nitrogen, hydrogen, or a combination of any of these.

Flow rates depend on the particular deposition chamber and substrate; examples of flow rates used for 300 mm substrates are between 200-4000 sccm $C_2H_2$; 50-20000 sccm $H_2$; and 50-20000 sccm He. In particular embodiments, the flow rates range from 200-2000 sccm $C_2H_2$; 6000-12000 sccm $H_2$; and 1000-12000 sccm He.

Figure 4C:
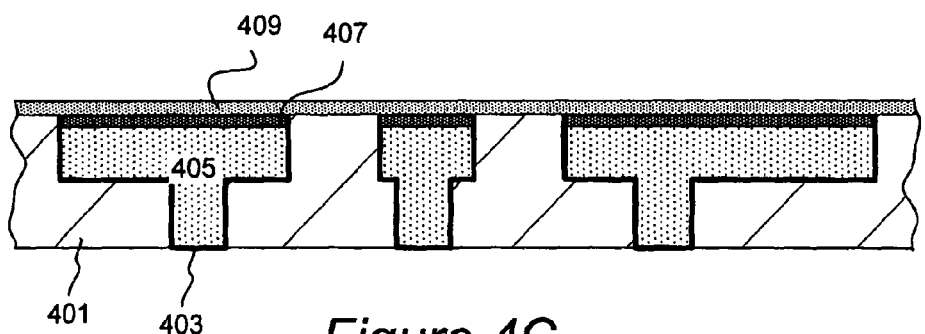

Referring to FIG. 4C, a hermetic hydrogen doped layer 409 is deposited. As indicated above, in certain embodiments, the methods of the invention use LFRF power to generate high energy ion bombardment. Low frequency RF power refers to RF power having a frequency between 100 kHz and 2 MHz. A typical frequency range for LF plasma source is between about 100 kHz to 500 kHz, e.g., 400 kHz frequency may be used. During deposition of the hermetic layer, LF power typically ranges from about 0.001-0.05 $W/cm^2$, in particular embodiments, from about 0.02-0.05 $W/cm^2$. HF power typically ranges from 0.001-0.02 $W/cm^2$ and in particular embodiments, from 0.02-0.05 $W/cm^2$. High frequency power refers to RF power with a frequency greater than 2 MHz. Typically HF RF frequency lies in the range of between about 2 MHz-30 MHz. A commonly used HF RF values include 13.56 MHz and 27 MHz In certain embodiments, the high energy ion bombardment is supplied by setting high LF/HF power ratio, e.g., ranging from about 2:1-50:1, in a particular embodiment 10:1. The described methods are not limited to RF plasma sources, but may use any suitable plasma source with high energy ion bombardment generated by using low precursor partial pressure and/or appropriately controlling the plasma generation.

Process (substrate) temperature is preferably below 500° C. In some embodiments, the process temperature is below about 400° C., for example, between about 30 and 400° C. In some embodiments, the process temperature is below about 300° C., for example between about 30 and 300° C. In particular embodiments, the process temperature is between about 50 and 250° C., e.g, between 150 and 250° C.

Chamber pressure may be any suitable pressure. In conventional deposition processes, pressure is typically 5-10 torr. In particular embodiments of deposition methods used herein, the total chamber pressure may be lower than conventionally used. For example, it may range from about 1-2 torr.

Hermetic layer deposition is continued until the desired thickness of film is deposited. According to various embodiments, between about 10 and 10000 angstroms is deposited. In some embodiments the hermetic layer is between about 50-2000 angstroms. The resulting device structure is presented in FIG. 4C. After the hermetic layer has been deposited, the device structure is subjected to the next processing step 307, which involves deposition of low-k silicon carbide material on top of the exposed hermetic carbon layer 409.

Deposition of Low-K Silicon Carbide

As discussed above, a variety of low-k silicon carbide materials can be used for the low-k layer deposited on top of the hermetic layer. Generally, any material with a dielectric constant of less than about 3.5 can be used as a top layer of the diffusion barrier film, provided that it has acceptable properties satisfying basic integration requirements for diffusion barrier and etch stop films. Low-k hydrogen doped silicon carbide, boron doped silicon carbide, and oxygen doped silicon carbide materials can be used. Methods of forming such materials are described in detail in the references cited above. Typically CVD and PECVD processes are used for low-k material deposition. As an example, formation of low-k hydrogen doped silicon carbide having high carbon content will now be described.

A partially fabricated IC device presented in FIG. 4C having an exposed hermetic layer 409 is provided to a deposition chamber of a PECVD apparatus. It is often desirable, that the device is not exposed to atmospheric environment throughout the diffusion barrier film deposition process. In some embodiments, the deposition of low-k top layer is performed in a multi-station tool at a station that is different from the station used for PSAB layer deposition and hermetic layer deposition. Such tool should preferably be isolated from atmospheric moisture and oxygen. In other embodiments, after the hermetic layer has been deposited, the partially fabricated device may be exposed to ambient environment for brief periods of time.

After the partially fabricated device has been provided to a PECVD chamber, a plasma discharge is ignited and a process gas comprising at least one precursor having high carbon content is flown into the chamber. For example, precursors having carbon content greater than about 24 atomic %, preferably greater than 30 or in some embodiments greater than 35 atomic percent may provide films with low dielectric constant. Such high carbon content is often associated with high degree of unsaturation in the precursor, e.g., presence of carbon-carbon triple bonds, double bonds and aromatic bonds. Therefore ethynyl, vinyl and phenyl substituted silanes present suitable precursors for low-k silicon carbide films. In particular, organosilicon precursors such as ethynyl-trimethylsilane, vinylphenylmethylsilane, phenyldimethylsilane, 3-(trimethylsilyl)cyclopentene, vinylphenyldimethylsilane and vinyldimethylsilane may be used. In some embodiments saturated organosilicon compounds such as tetramethylsilane, tri-iso-propylsilane, 1,1,3,3-tetramethyl 1,3-disilacyclobutane may also be used. The organosilicon precursor can be flown at a rate in the range of approximately 1 to 2000 sccm. In some embodiments a liquid precursor is flown at a rate in the range of about 0.3-5.0 mL/min and is further vaporized. Process gas may include carrier gas, e.g., He and/or $H_2$ and/or Ar in the range of approximately 0 to 9000 sccm. The PECVD process may be performed at temperatures in the range of approximately 200 to 425° C., preferably in the range of about 350 to 400° C. Pressure may range from about 0.1 torr to 10 torr (e.g. about 4-8 torr). High frequency RF power may range from about 500 to 3000 W and low frequency RF power may range from 0 to 1000 W. Alternatively, the PECVD process may be performed at a frequency of approximately 13.56 MHz or 27 MHz.

In other embodiments low-k hydrogen-doped silicon carbide films may be obtained by using a process gas comprising an organosilicon gas or vapor and a hydrocarbon gas or vapor. In this case organosilicon gas does not necessarily need to have high carbon content, and may include saturated alkylsilanes and silylalkanes such as tetramethylsilane, tri-iso-propylsilane, 1,1,3,3-tetramethyl 1,3-disilacyclobutane and the like. The hydrocarbon can be any hydrocarbon, such as, for example defined by formula $C_xH_y$, wherein X can be 2 to 10, and Y is 2 to 22. Specific hydrocarbon examples include methane, acetylene, ethylene, propylene, butane, cyclohexane, benzene and toluene and ($CH_4$, $C_2H_2$, $C_2H_4$, $C_3H_6$, $C_4H_{10}$, $C_6H_6$, $C_6H_{12}$ and $C_7H_8$, respectively). Of these, unsaturated hydrocarbons are preferred. For example, ethylene ($C_2H_2$) can be used. Hydrocarbon gas or vapor is typically flown into PECVD chamber at a flow rate of about 500-4000 sccm simultaneously with organosilicon precursor. In some embodiments hydrocarbon is flown at a greater flow rate than the organosilicon precursor. For example it may be flown at least about twice as fast as an organosilicon precursor. Pressure and temperature conditions may be similar to those of the previously described embodiment. In some embodiments, pressure between about 1-8 Torr is used. Such method allows deposition of silicon carbide films with a dielectric constant less than about 3.5 by using simple organosilicon and hydrocarbon precursors, such as tetramethylsilane and ethylene.

Figure 4D:
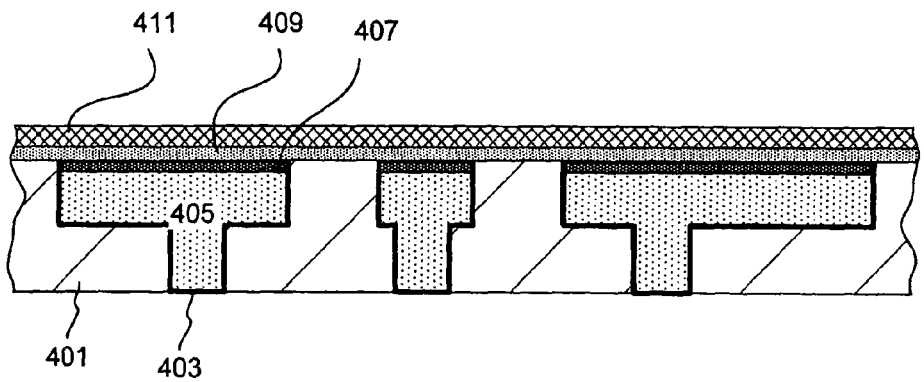

The low-k silicon carbide layer is deposited until a desired thickness of the layer is achieved. The deposited layer may have a thickness of about 10-10000 Å, more typically from about 10 to 1000 Å, and in some embodiments from about 10 to 100 Å. Referring to FIG. 4D, a device structure having a completed low-k diffusion barrier film is shown. The diffusion barrier film resides on a dielectric layer 401 and on PSAB-capped metal lines 405 and includes a bottom layer of hermetic hydrogen-doped carbon 409 and a top layer of low-k silicon carbide 411.

Apparatus

The present invention can be implemented in many different types of apparatus, such as chemical vapor deposition (CVD) reactors and spin-coating systems. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing barrier layer deposition is transferred from one station to another within the reactor during the process. While in process, each wafer is held in place by a pedestal, wafer chuck and/or other wafer holding apparatus. For certain operations in which the wafer is to be heated, the apparatus may include a heater such a heating plate. In a preferred embodiment of the invention, a PECVD (Plasma Enhanced Chemical Vapor Deposition) system may be used. In even more preferred embodiments the PECVD system includes a LF RF power source.

Figure 5:
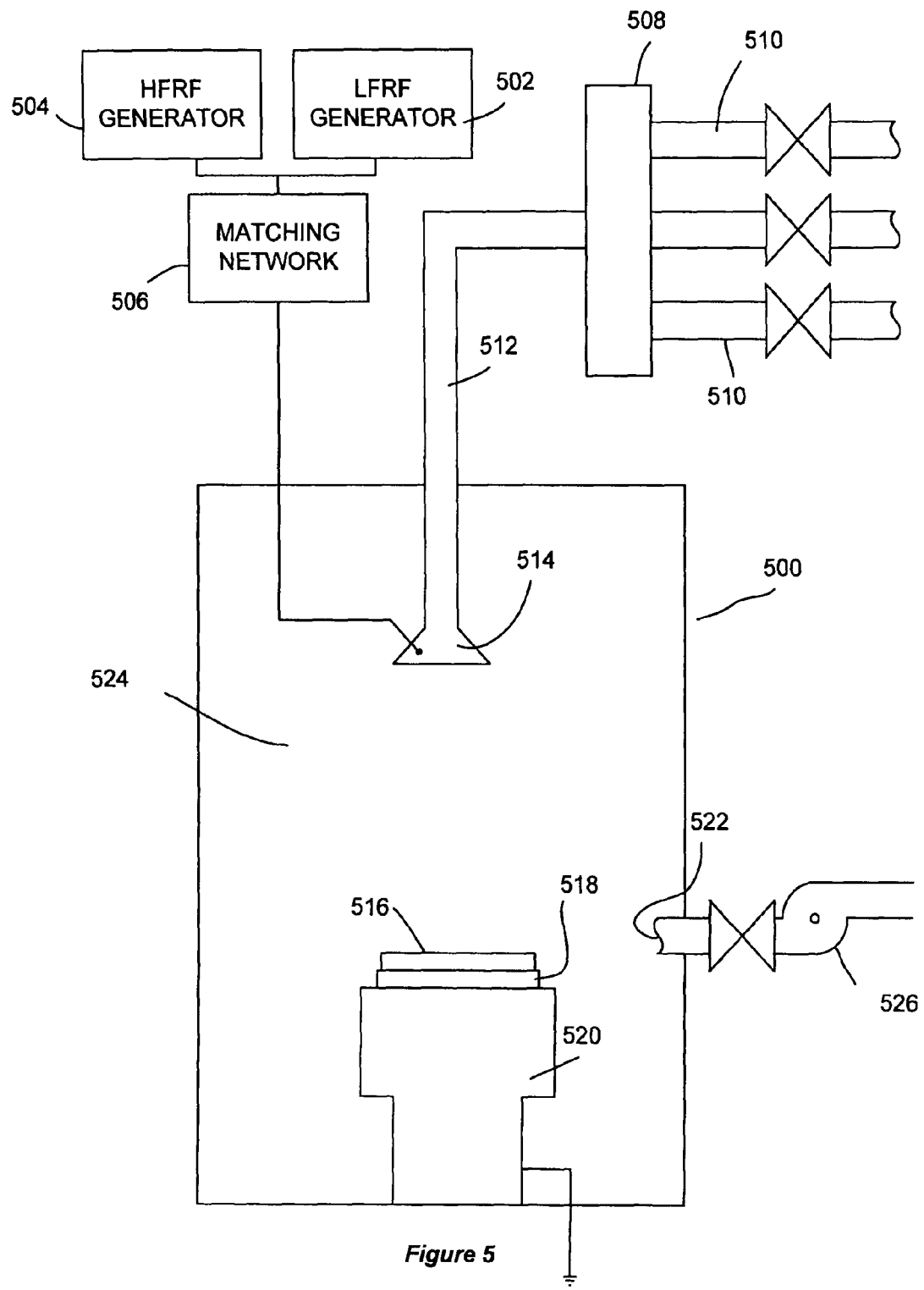
FIG. 5 is a schematic representation of a PECVD apparatus capable of using low frequency (LF) and high frequency (HF) radio frequency plasma sources that can be used for depositing copper diffusion barrier films in accordance with some embodiments of present invention

FIG. 5 provides a simple block diagram depicting various reactor components arranged for implementing the present invention. As shown, a reactor 500 includes a process chamber 524, which encloses other components of the reactor and serves to contain the plasma generated by a capacitor type system including a showerhead 514 working in conjunction with a grounded heater block 520. A high-frequency RF generator 502 and a low-frequency RF generator 504 are connected to a matching network 506 that, in turn is connected to showerhead 514.

Within the reactor, a wafer pedestal 518 supports a substrate 516. The pedestal typically includes a chuck, a fork, or lift pins to hold and transfer the substrate during and between the deposition reactions. The chuck may be an electrostatic chuck, a mechanical chuck or various other types of chuck as are available for use in the industry and/or research.

The process gases are introduced via inlet 512. Multiple source gas lines 510 are connected to manifold 508. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 500 via an outlet 522. A vacuum pump 526 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

Figure 6:
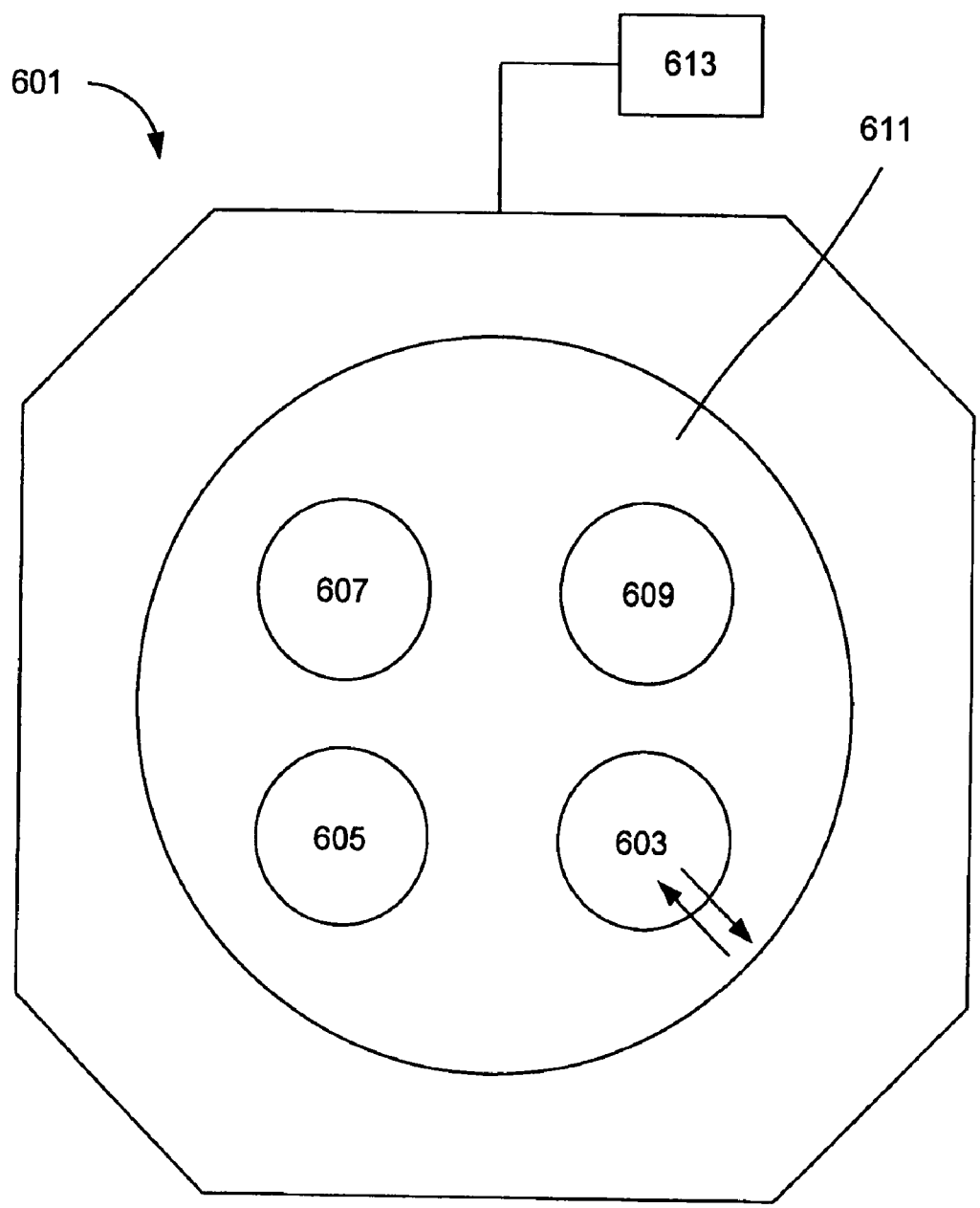
FIG. 6 is a schematic representation of a multi-station PECVD apparatus suitable for forming PSAB layers and copper diffusion barrier films in accordance with some embodiments of present invention.

In one of the embodiments a multi-station apparatus may be used for depositing a PSAB layer and a diffusion barrier or etch stop film. The multi-station reactor allows one to run different processes concurrently in one chamber environment, thereby increasing the efficiency of wafer processing. An example of such an apparatus is depicted in FIG. 6. A schematic presentation of top view is shown. An apparatus chamber 601 comprises four stations 603-609. In general, any number of stations is possible within the single chamber of a multi-station apparatus. Station 603 is used for loading and unloading of the substrate wafers. Stations 603-609 may have the same or different functions. For example, some of the stations may be devoted to PSAB formation operation, while other stations may be used for depositing individual layers of the diffusion barrier film.

In one of the embodiments, individual stations can operate under distinct process conditions and may be substantially isolated from each other. For example one station may operate under one temperature regime, while another may operate under a different temperature regime.

In one embodiment, PSAB layer deposition and hermetic layer deposition are performed in one preferred temperature regime and are carried out in one station of the multi-station apparatus. The deposition of low-k silicon carbide may require a different temperature regime, and may be carried out in a different station or stations.

For example, station 605 may be devoted to formation of the PSAB layer and to deposition of the hermetic layer of hydrogen-doped carbon. Station 605 may operate at a temperature range of about 250-275° C., which is preferred in some embodiments for both PSAB formation and hermetic layer deposition. Deposition of low-k silicon carbide can be carried out in stations 607, 607, and 603 at a temperature range of about 350 to 400° C., which is the preferred process temperature according to some embodiments of the silicon carbide deposition process.

According to an embodiment described above, station 605 is a PSAB formation station and a hermetic layer deposition station. In other embodiments, where formation of the PSAB layer is not required, station 605 may serve only for deposition of hermetic layer. Stations 607, 609, and 603 may all serve for deposition of low-k silicon carbide layer. An indexing plate 611 is used to lift the substrates off the pedestals and to accurately position the substrates at the next processing station. After the wafer substrate is loaded at station 603, it is indexed to station 605, where formation of the PSAB layer and of the hermetic hydrogen-doped carbon layer is performed. The wafer is then moved to station 607 where deposition of low-k silicon carbide is performed. The substrate is further indexed to station 609, where further deposition of low-k silicon carbide is performed, and then indexed to station 603 to deposit more of low-k silicon carbide. The processed wafer is unloaded at station 603, and the module is charged with a new wafer. During normal operation, a separate substrate occupies each station and each time the process is repeated the substrates are moved to new stations. Thus, an apparatus having four stations 603, 605, 607, and 609 allows simultaneous processing of four wafers, wherein at least one station performs a process that is different from the processes performed at other stations. Alternatively, four wafers may be subjected to identical operations at all four stations, without dedicating certain stations to deposition of a particular layer.

The process conditions and the process flow itself can be controlled by a controller unit 613 which comprises program instructions for a monitoring, maintaining and/or adjusting certain process variables, such as HF and LF power, gas flow rates, temperature, pressure and the like. For example, instructions specifying flow rates of silane and ammonia for PSAB deposition may be included. Further, instructions specifying flow rates of hydrocarbon precursors and power levels of HF and LF RF sources during deposition of hermetic layer may be included, etc. In general, instructions may comprise instructions for process conditions for any of the processes described in the previous sections. The controller may comprise different or identical instructions for different apparatus stations, thus allowing the apparatus stations to operate either independently or synchronously.

EXAMPLES

Figure 7:
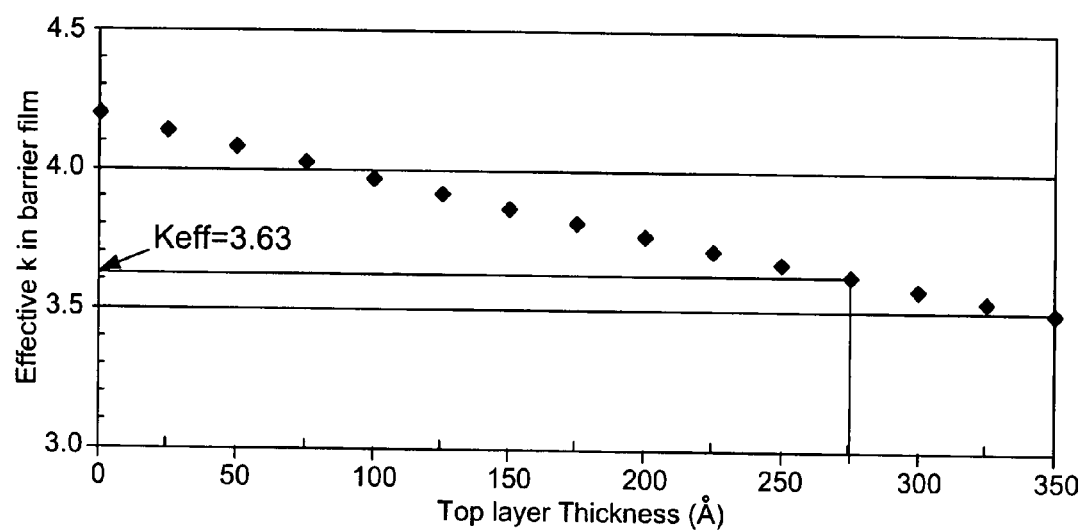
FIG. 7 is a simulation plot illustrating effective dielectric constant of a bi-layer diffusion barrier film as a function the thickness of a low-k hydrogen doped layer.

Formation of hermetic diffusion barrier films with a dielectric constant of less than about 4 will be illustrated by several specific examples. FIG. 7 illustrates a simulation plot of effective dielectric constant of a bi-layer diffusion barrier film as a function of thickness of the top low-k silicon carbide layer. The total thickness of the diffusion barrier bilayer film having a bottom hermetic hydrogen-doped carbon layer and a top low-k silicon carbide layer is 350 Å in this example. Dielectric constant of hydrogen-doped carbon material provided in this illustration is about 4.2, while dielectric constant of the low-k silicon carbide material in this example is 3.5. Depending on relative thicknesses of the constituent layers, the bi-layer film may have an effective dielectric constant ranging from about 3.5 to 4.2. Preferably, bi-layer films with a dielectric constant less than about 4.0 should be used as diffusion barriers. Referring to the example, illustrated in FIG. 7, this will correspond to a 350 Å thick bi-layer having a layer of low-k silicon carbide that is thicker than 75 Å. For example, as illustrated, a bi-layer consisting of 75 Å thick layer of hydrogen-doped carbon and 275 Å thick layer of hydrogen-doped silicon carbide will have an effective dielectric constant of about 3.6.

In some embodiments, thickness of the low-k silicon carbide layer should be at least about 20% of the total diffusion barrier film thickness, more preferably at least about 50%. It is understood, that the lower is the dielectric constant of the silicon carbide used for this layer the thinner layers of silicon carbide will be required to maintain an effective dielectric constant of less than about 4. For example in some embodiments, the silicon carbide layer may have a thickness that is at least about 10% of the total diffusion barrier thickness.

It is also understood that typically a certain minimum thickness of hermetic hydrogen-doped carbon layer is needed to maintain hermeticity of the diffusion barrier film at a preferred level. For example thickness of hydrogen-doped carbon layer should be at least about 20 Å or at least about 50% of the total thickness of the diffusion barrier film, according to some embodiments.

Experimental details on deposition parameters are presented below.

A variety of diffusion barrier films have been deposited using a number of process conditions. Example deposition conditions are provided below. When ranges are provided, the ranges delineate the outer limits of parameters that were experimentally tested.

Hermetic hydrogen doped carbon layers with thicknesses ranging from about 75 to 1500 Å were deposited by treating a process gas composed of ethylene ($C_2H_2$), and hydrogen ($H_2$) with plasma at 250° C. under a pressure of 1 Torr. Flow rates of ethylene and hydrogen were 1500 and 6000 sccm respectively. Deposition rates were at about 700 Å/min. Plasma was generated using LF RF source at a power level of 1200 W and an HF RF source at a power level of 400 W. Note the low partial pressure of hydrocarbon in the mixture (correlating with a low flow rate) and an increased LF component used during plasma generation. The obtained films possessed a dielectric constant of about 4.0 and an excellent hermeticity evidenced by a tensile TEOS shift ranging from about 1 to 7 MPa. The films also exhibited good stability evidenced by dielectric constant shift of about 0.1 and a stress shift of about 5-8 MPa.

Low-k hydrogen doped silicon carbide layers with thicknesses ranging from about 50 to 2000 angstroms were deposited by treating a process gas composed of tetramethylsilane (($CH_3$)$_4$Si) and ethylene with plasma at 250-400° C. under a pressure of 4-6 torr. Flow rates of tetramethylsilane and ethylene were 300-1200 and 1000-5000 sccm respectively. Plasma was generated using LF RF source at a power level of 300-900 W and an HF RF source at a power level of about 1800-3000 W. The obtained films had a dielectric constant of about 3.5. They exhibited good stability evidenced by a dielectric constant shift of about 0.1.

Other properties including etch selectivity, stability and mechanical strength of the films described herein were within normal ranges for copper diffusion barrier and etch stop films.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the invention is not to be limited to the details given herein, but may be modified within the scope of the appended claims. It is understood, that in certain embodiments the diffusion barrier film may include more than two layers. For example, it may include additional layers of doped or undoped silicon carbide to modulate the properties of the film. Further, in some embodiments, especially in those embodiments which employ a multi-layer diffusion barrier film stack, the diffusion barrier film may have a dielectric constant greater than 4. For example, for some applications barrier films with a dielectric constant of about 4.0-4.2 may be used.

What is claimed is:

1. A method of forming a copper diffusion barrier film in a semiconductor device, the method comprising:
   (a) receiving a semiconductor substrate comprising an exposed dielectric layer;
   (b) forming a hermetic hydrogen doped carbon layer on at least a portion of the exposed dielectric layer, wherein the hermetic hydrogen doped carbon layer consists essentially of carbon and hydrogen; and
   (c) forming a hydrogen doped silicon carbide layer on the hydrogen doped carbon layer, wherein together the hydrogen doped silicon carbide layer and the hydrogen doped carbon layer serve as the copper diffusion barrier film, and wherein said copper diffusion barrier film has an effective dielectric constant of less than about 4.0.

2. The method of claim 1, wherein in (a) the semiconductor substrate further comprises exposed copper lines or interconnects and the semiconductor substrate provides a substantially planar surface.

3. The method of claim 2, further comprising forming a PSAB capping layer on at least some of the exposed copper lines or interconnects prior to operation (b).

4. The method of claim 3, wherein forming the PSAB capping layer comprises transforming a top portion of exposed copper by reacting copper atoms with a first reactant selected from the group consisting of $SiH_4$, $GeH_4$, $PH_3$, $B_2H_6$, $AsH_3$, $H_2S$, $H_2Se$, $H_2Te$, $CH_4$, and $C_xH_y$, to afford a layer of material selected from the group consisting of $Cu_xSi_y$, $Cu_xGe_y$, $Cu_xP_y$, $Cu_xB_y$, $Cu_xAs_y$, $Cu_xS_y$, $Cu_xSe_y$, $Cu_xTe_y$, and $Cu_xC_y$.

5. The method of claim 4, wherein forming the PSAB capping layer further comprises contacting the layer of material selected from the group consisting of $Cu_xSi_y$, $Cu_xGe_y$, $Cu_xP_y$, $Cu_xB_y$, $Cu_xAs_y$, $Cu_xS_y$, $Cu_xSe_y$, $Cu_xTe_y$, and $Cu_xC_y$, with a second reactant selected from the group consisting of $N_2$, $NH_3$, $CH_4$, $C_2H_4$, $C_2H_2$, $C_xH_y$, a gas from the family of methyl-substituted silanes, a gas from the family of methyl-substituted amines and HMDS, to afford a material selected from the group consisting of nitrogen (N), carbon (C) or silicon (Si) doped $Cu_xSi_y$, $Cu_xGe_y$, $Cu_xP_y$, $Cu_xB_y$, $Cu_xAs_y$, $Cu_xS_y$, $Cu_xSe_y$, $Cu_xTe_y$, and $Cu_xC_y$.

6. The method of claim 5, wherein the first reactant is $SiH_4$, the second reactant is $NH_3$, and the formed PSAB layer comprises $Si_xN_y$.

7. The method of claim 3, wherein forming the PSAB capping layer comprises plasma enhanced chemical vapor deposition (PECVD).

8. The method of claim 7, wherein the PSAB capping layer is formed at a temperature of less than 300° C.

9. The method of claim 1, wherein operation (b) is performed by a PECVD process.

10. The method of claim 1, wherein operation (b) comprises:
   providing the semiconductor substrate in a deposition chamber;
   exposing the substrate to a process gas comprising a hydrocarbon precursor gas having a partial pressure between about 0.01 and 4 Torr;
   depositing the hydrogen doped carbon layer on at least a portion of the exposed dielectric layer by a PECVD process using a dual frequency RF (LF and HF) power in which LF:HF ratio is at least about 2:1.

11. The method of claim 10, wherein the hydrogen doped carbon layer is formed at a process temperature of between about 30 and 300° C.

12. The method of claim 10, wherein the process gas further comprises hydrogen gas and helium gas.

13. The method of claim 1, wherein the layer of hydrogen doped silicon carbide has a composition of at least 40% carbon.

14. The method of claim 1, wherein the layer of hydrogen doped silicon carbide is formed by a PECVD process.

15. The method of claim 14, wherein the PECVD uses a silicon carbide precursor selected from the group consisting of tetramethylsilane, ethynyltrimethylsilane, vinylphenylmethylsilane, phenyldimethylsilane, tri-iso-propylsilane, 3-(trimethylsilyl)cyclopentene, vinylphenyldimethylsilane, and vinyldimethylsilane.

16. The method of claim 15, wherein the PECVD uses a silicon carbide precursor selected from the group consisting of ethynyltrimethylsilane, vinylphenylmethylsilane, phenyldimethylsilane, tri-iso-propylsilane, 3-(trimethylsilyl)cyclopentene, vinylphenyldimethylsilane and vinyldimethylsilane.

17. The method of claim 15, wherein the PECVD uses a silicon carbide precursor selected from the group consisting of ethynyltrimethylsilane, 3-(trimethylsilyl)cyclopentene, and vinyldimethylsilane.

18. The method of claim 14, wherein PECVD uses a silicon carbide precursor having a composition with a C:Si ratio of at least 2:1.

19. The method of claim 14, wherein PECVD uses a silicon carbide precursor having a composition with a C:Si ratio of at least 3:1.

20. The method of claim 1, wherein, wherein the copper diffusion barrier film has a hermeticity defined by a stress shift of tensile TEOS underlying the film, of less than 10 MPa.

21. The method of claim 1, wherein the hydrogen doped carbon layer has a thickness of about 10-10000 Å.

22. The method of claim 1, wherein the hydrogen doped silicon carbide layer has a thickness of about 10-10000 Å.

23. The method of claim 1, wherein operations (b) and (c) are performed at different stations of a multi-station apparatus.

24. The method of claim 3, wherein formation of the PSAB layer and operation (b) are performed at one station of a multi-station apparatus and operation (c) is performed at a different station of the multi-station apparatus.

* * * * *